United States Patent
Lu

(10) Patent No.: US 8,762,911 B1
(45) Date of Patent: Jun. 24, 2014

(54) LAYOUT AND DESIGN SYSTEM FOR INCREASING ELECTRIC CURRENT IN CMOS INVERTERS

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/888,752

(22) Filed: May 7, 2013

(51) Int. Cl.
*G06F 17/50* (2006.01)
(52) U.S. Cl.
USPC .......................................... 716/110; 716/119
(58) Field of Classification Search
USPC .................................................. 716/110, 119
See application file for complete search history.

(56) References Cited

U.S. PATENT DOCUMENTS

| | | | |
|---|---|---|---|
| 5,532,509 A | 7/1996 | D'Addeo | |
| 6,339,354 B1 | 1/2002 | Heightley | |
| 6,469,559 B2 | 10/2002 | Heightley | |
| 7,564,703 B1 | 7/2009 | Braun et al. | |
| 7,849,431 B2 | 12/2010 | Kim | |
| 8,178,908 B2 * | 5/2012 | Greenberg et al. | 257/211 |
| 2001/0032329 A1 | 10/2001 | Lee et al. | |
| 2002/0188920 A1 | 12/2002 | Lampaert et al. | |
| 2004/0222422 A1 | 11/2004 | Sun et al. | |
| 2005/0007839 A1 | 1/2005 | Madurawe | |
| 2005/0076316 A1 | 4/2005 | Pierrat et al. | |
| 2005/0146942 A1 | 7/2005 | Madurawe | |
| 2006/0113657 A1 | 6/2006 | Ejury | |
| 2007/0235815 A1 | 10/2007 | Kim | |
| 2008/0028353 A1 | 1/2008 | Lu et al. | |
| 2009/0004791 A1 | 1/2009 | Madurawe | |
| 2011/0083116 A1 * | 4/2011 | Pineda de Gyvez et al. | . 716/120 |
| 2012/0227020 A1 | 9/2012 | Dewey, III et al. | |
| 2012/0254820 A1 | 10/2012 | Lu | |
| 2012/0311518 A1 | 12/2012 | Lu | |

FOREIGN PATENT DOCUMENTS

| | | |
|---|---|---|
| CN | 101533420 A | 9/2009 |
| CN | 102411642 A | 4/2012 |
| EP | 1983641 A2 | 10/2008 |
| JP | 2004064247 A | 2/2004 |
| KR | 2005028969 | 3/2005 |

OTHER PUBLICATIONS

Berridge, et al., "IBM POWER6 microprocessor physical design and design methodology," IBM Journal of Research and Development, vol. 51, No. 6, Nov. 2007, pp. 685-714.

(Continued)

*Primary Examiner* — Suresh Memula
(74) *Attorney, Agent, or Firm* — Gibb & Riley, LLC; David A. Cain, Esq.

(57) ABSTRACT

A method of designing a layout, a design system and a computer program product for a multi-finger complementary metal oxide semiconductor (CMOS) inverter including a multi-finger N-type field effect transistor (NFET) and a multi-finger P-type field effect transistor (PFET) is disclosed. The design of the layout disposes a metallization wire connecting multiple drains of each type of MOS transistor. Analysis of an electric current in each segment of the metallization wire and of a total resistance of in all segments of the metallization wire provides an optimal location where the metallization wires for NFET drains and PFET drains are connected. The optimal wire connection location provides maximum drain current for the CMOS inverter along with a low wire capacitance between the wire and the gates of NFETs and PFETs.

20 Claims, 24 Drawing Sheets

(56) References Cited

OTHER PUBLICATIONS

Yoon, et al., "A VLSI Circuit Extractor with a Parallel Algorithm," IEEE, 1994, pp. 306-310.

Malhi, et al., "Overlaid CMOS," Electronics Letters, vol. 22, No. 11, May 22, 1986, pp. 598-599.

Maheshwaram, et al., "Device Circuit Co-Design Issues in Vertical Nanowire CMOS Platform," IEEE Electron Device Letters, vol. 33, No. 7, Jul. 2012, pp. 934-936.

Diamantidis, et al., "Design and Development of a Low Cost Inverter Drive for Induction Motors," Applied Power Electronic Conference and Exposition, 1996, pp. 771-777.

Ramos, et al., "Exploration of the Circuit Potential of Multiple-Gate Field-Effect Transistors," IEEE International SOI Conference Proceedings, 2006, pp. 167-168.

Jiang, et al., "Model Analysis of Multi-Finger MOSFET Layout in Ring Oscillator Design," 12th International Symposium on Quality Electronic Design, IEEE, 2011, pp. 347-352.

Sawyer, Ed, "New Inverter Layout and DC Link Capacitor Integration for Increased System Density and Performance," IEEE, 2008, pp. 2818-2822.

\* cited by examiner

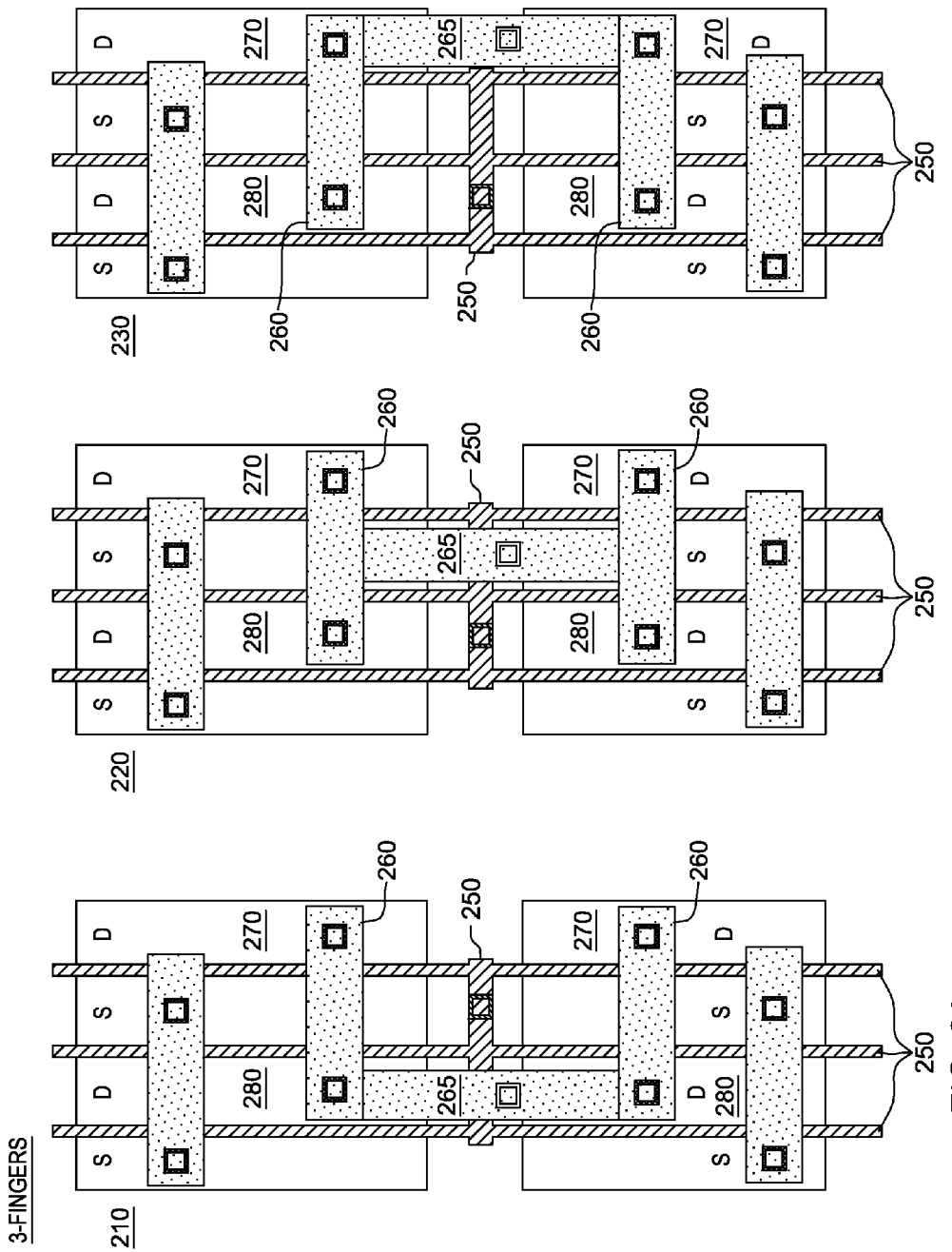

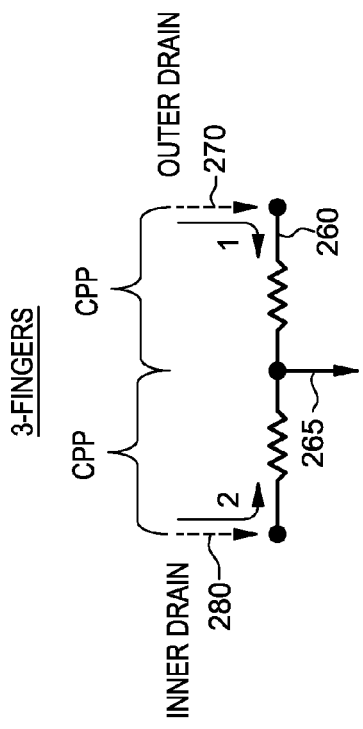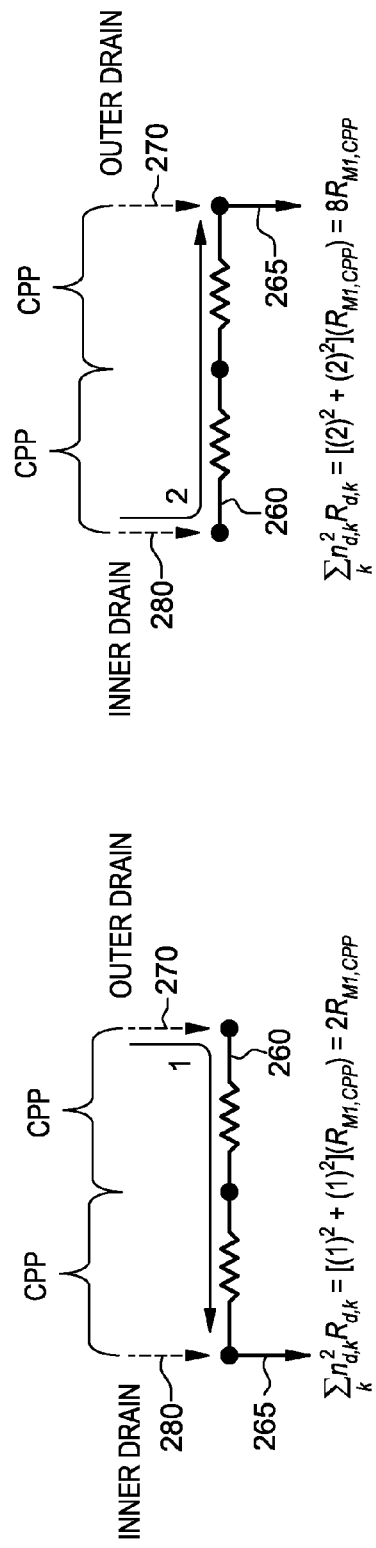

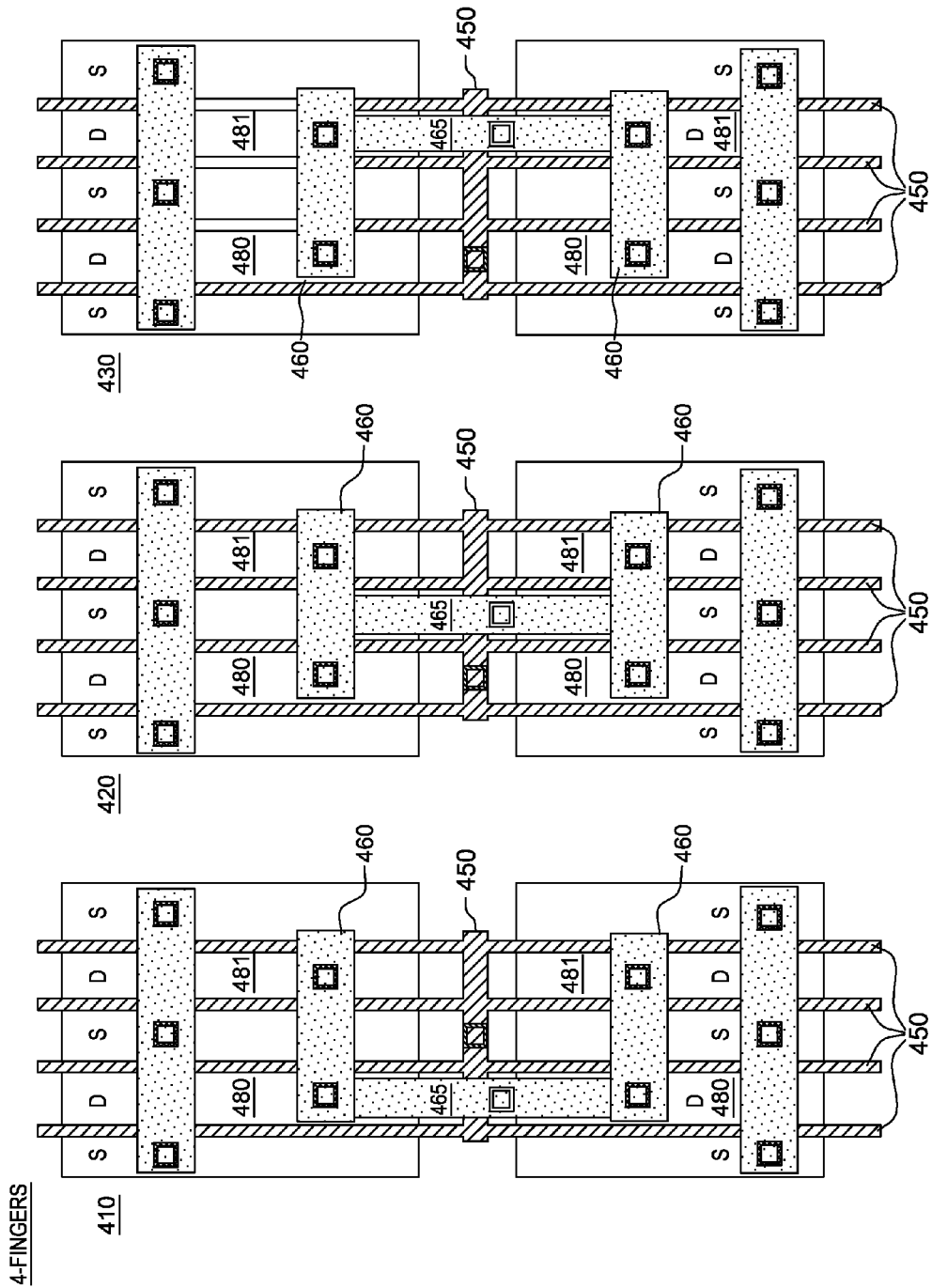

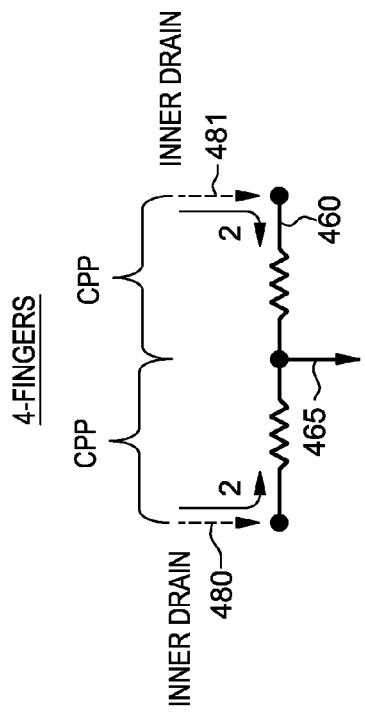
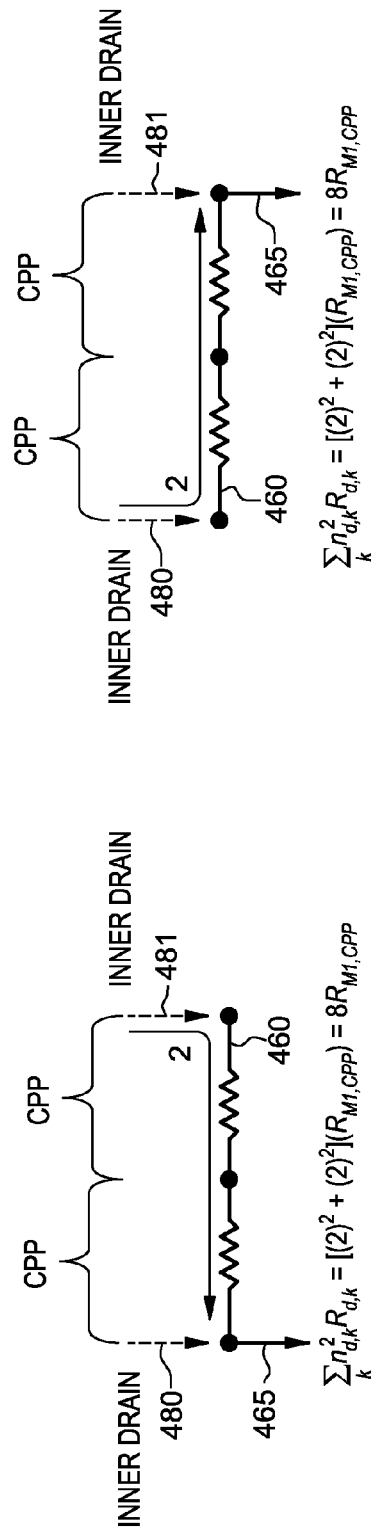

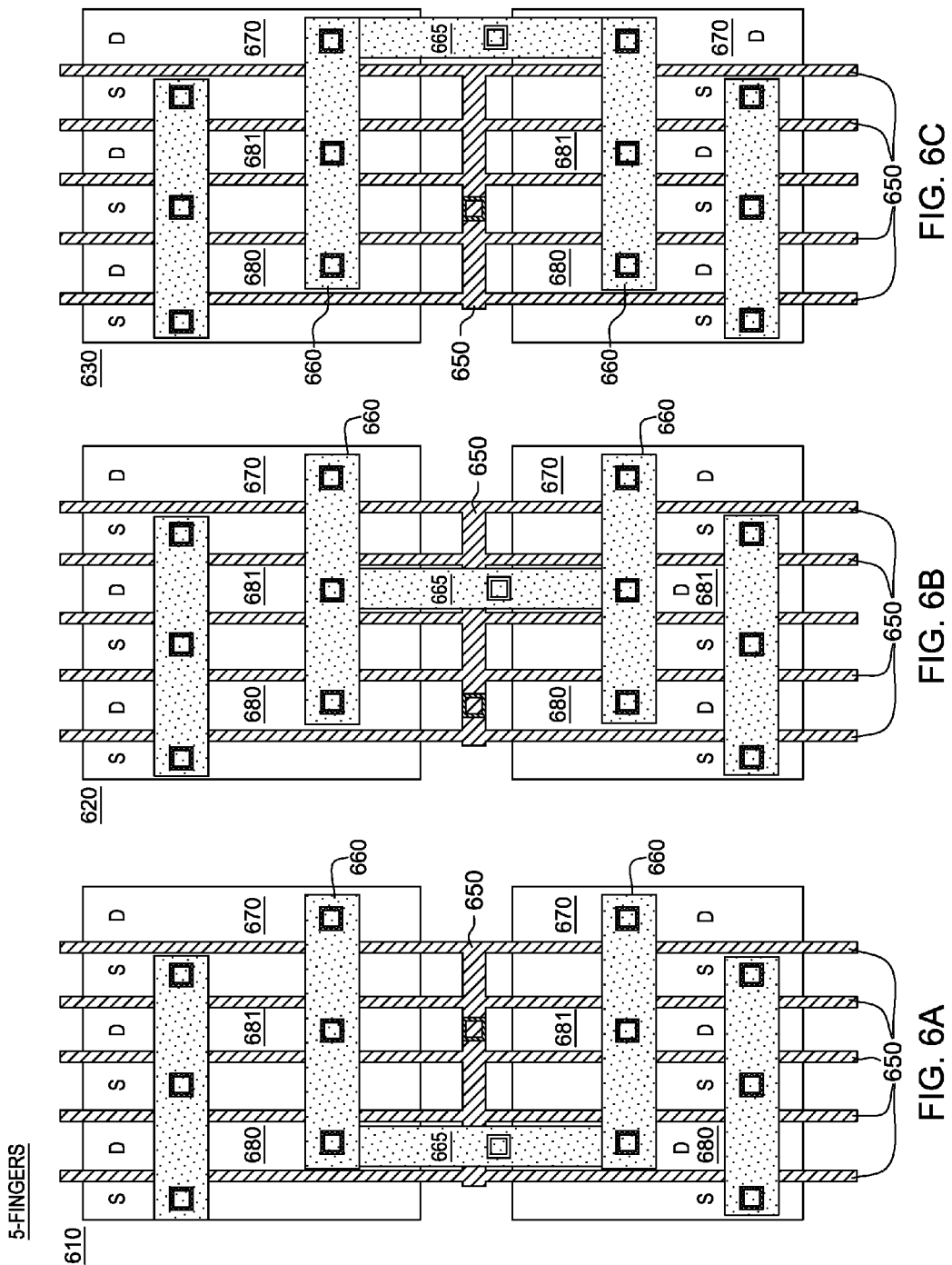

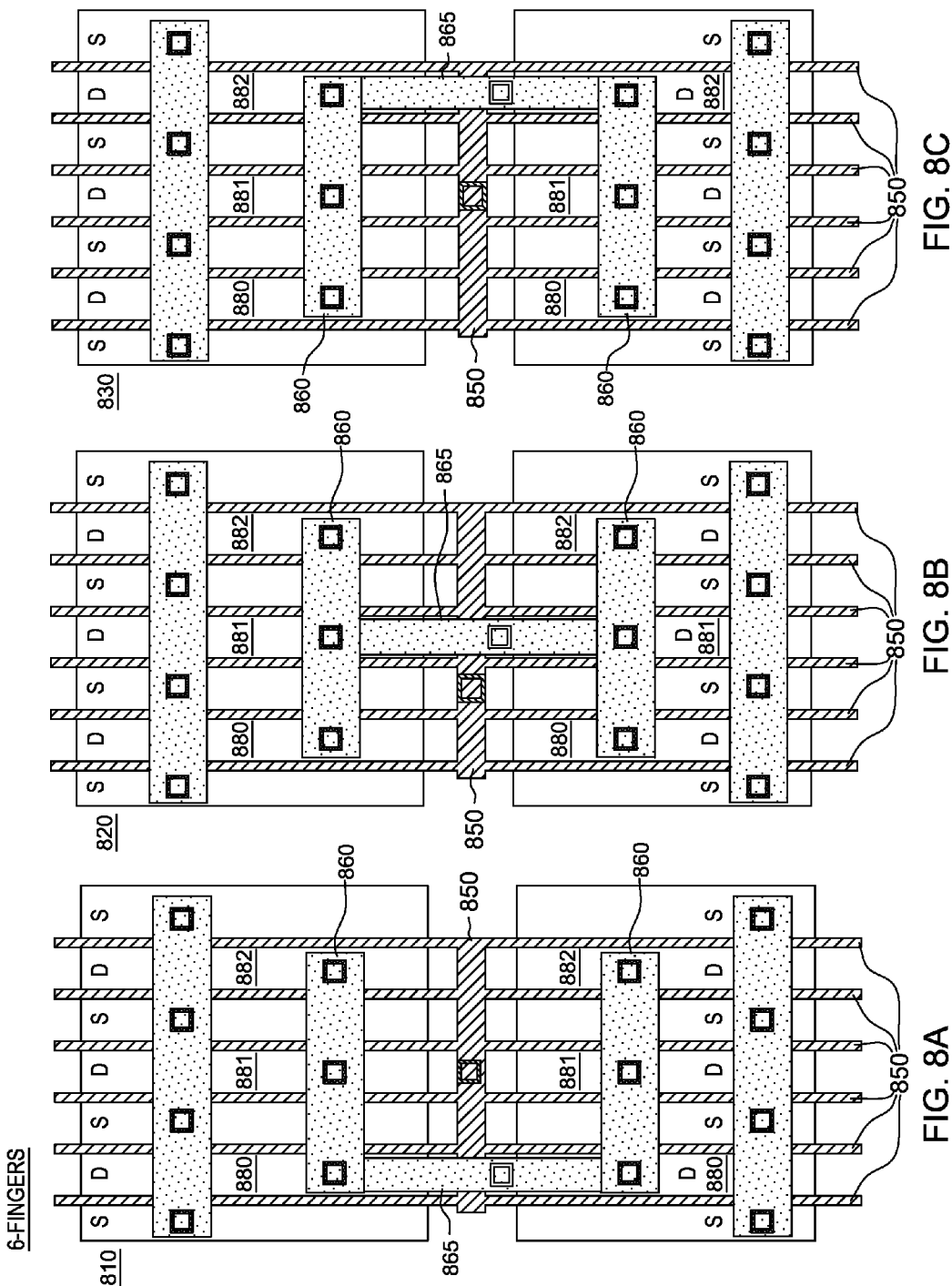

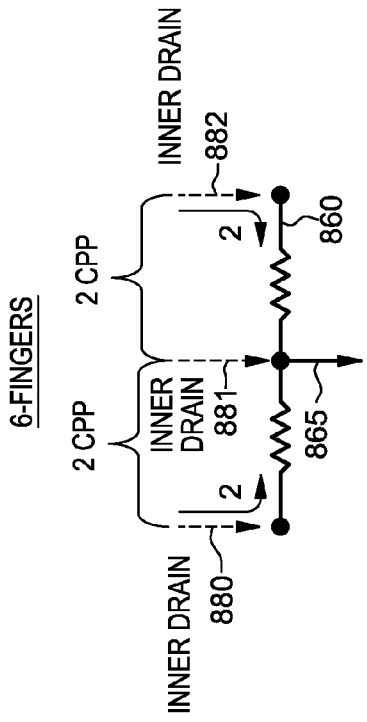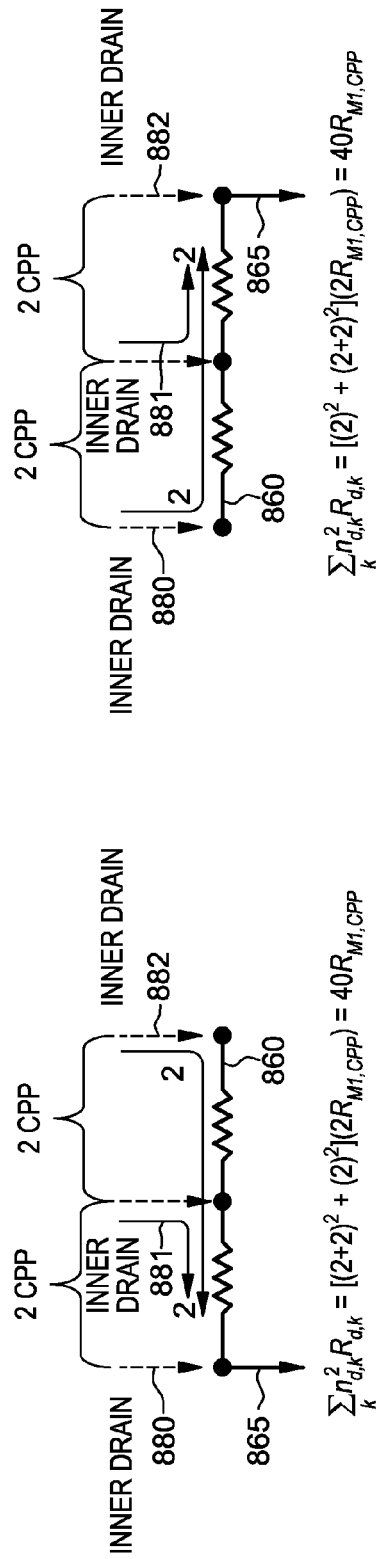
FIG. 9B
FIG. 9C
FIG. 9A

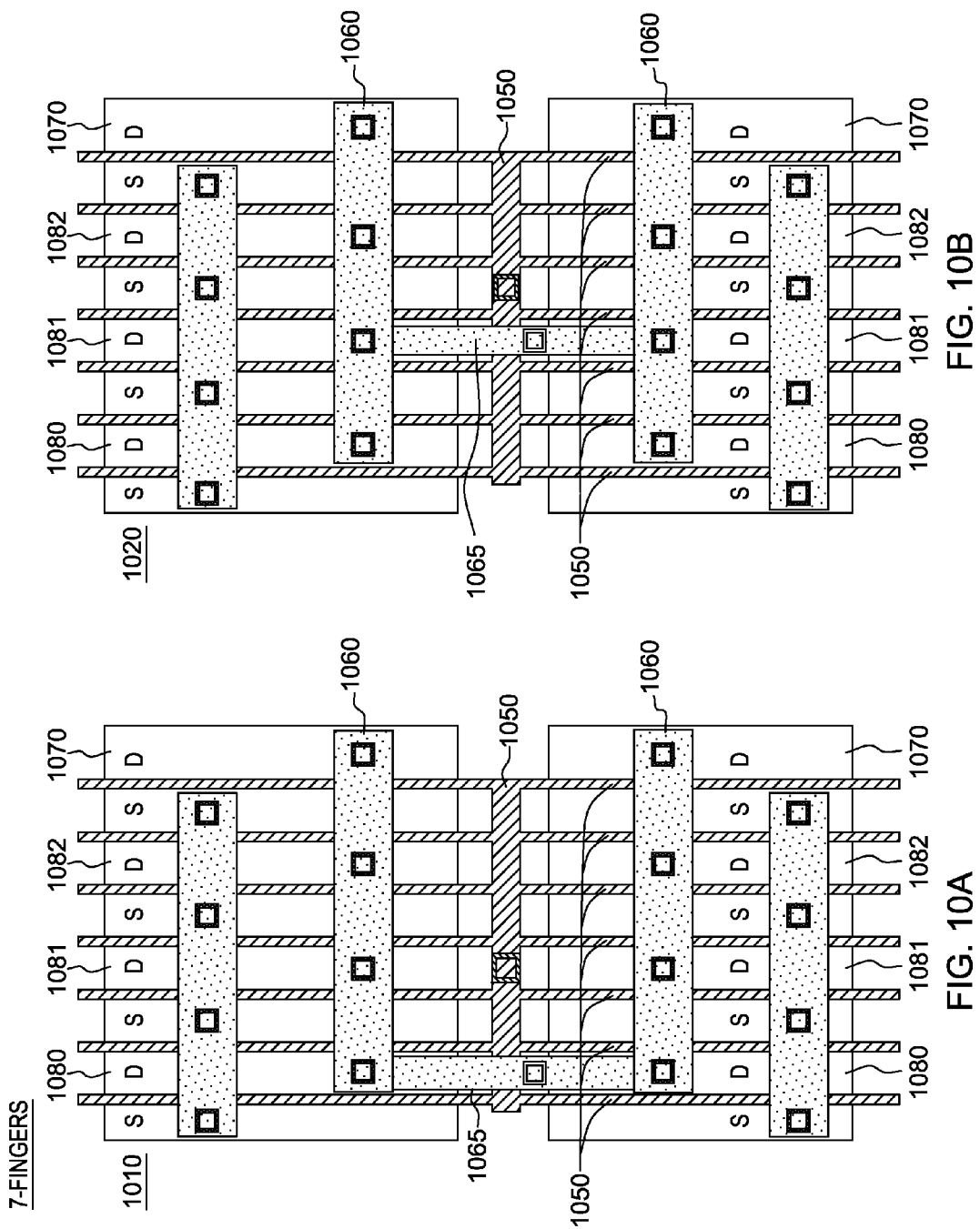

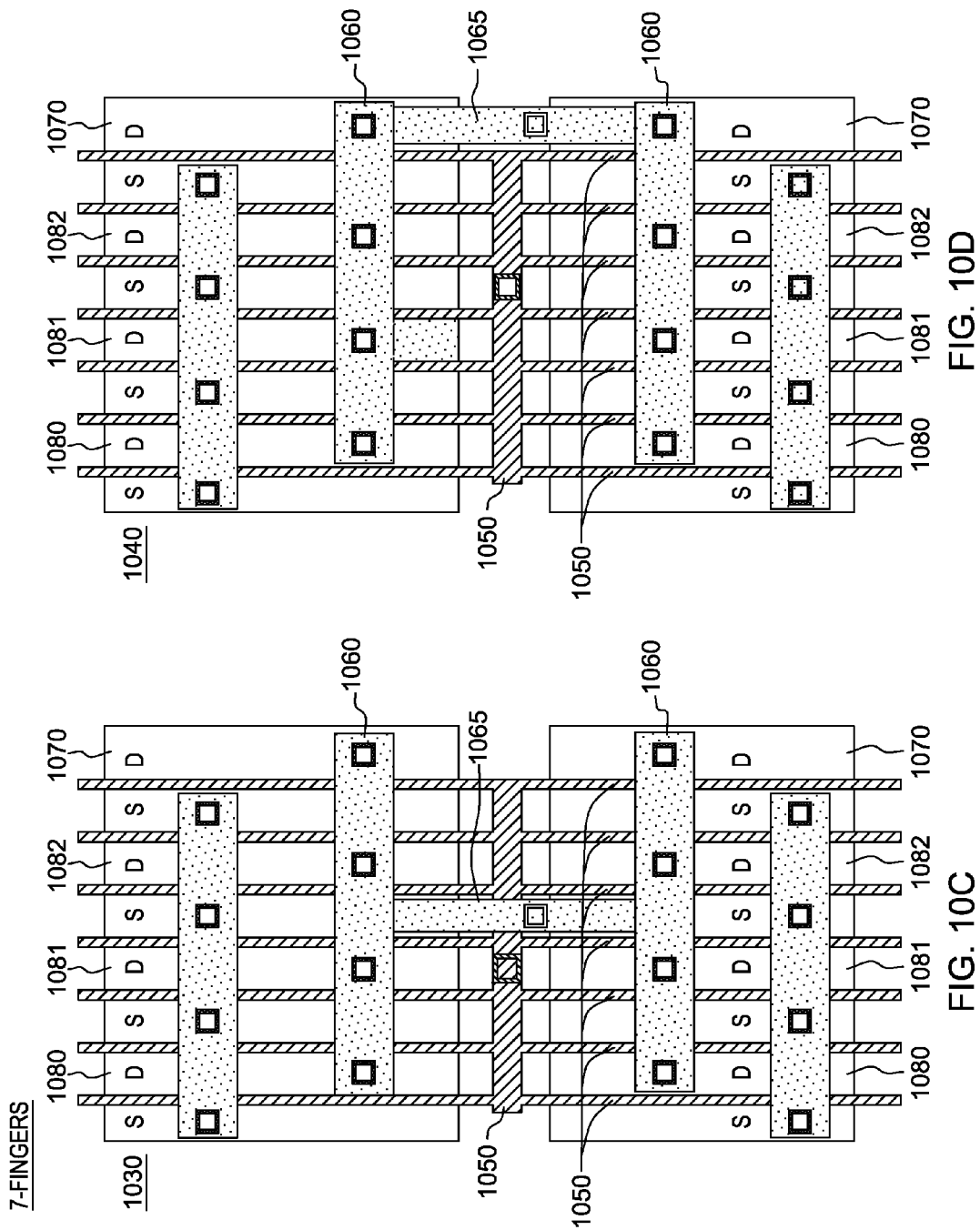

LAYOUT AND DESIGN SYSTEM FOR INCREASING ELECTRIC CURRENT IN CMOS INVERTERS

BACKGROUND

1. Field of the Invention

The present disclosure relates to a method of designing a layout, a design system and a computer program product for a multi-finger complementary metal oxide semiconductor (CMOS) inverter including a multi-finger N-type field effect transistor (NFET) and a multi-finger P-type field effect transistor (PFET). More particularly, a selected layout of common output nodes that are formed on metallization wires, which connect the drain regions of the multi-finger NFET and the drain regions of the multi-finger PFET of the CMOS inverter, respectively, can reduce parasitic drain-node wire resistance without increasing wiring capacitance and thus, maximize output current for the CMOS inverter and to reduce the CMOS inverter's delay.

2. Description of Related Art

Inverters are widely used in circuit design. For example, inverters are used in ring oscillators to benchmark, characterize and compare circuits within an integrated circuit device. Inverters are also used in repeaters to reduce an interconnect's resistance-capacitance (RC) delay. Reducing RC delay is desirable and can be accomplished by reducing the electrical resistance to the total drain currents of the complementary transistors of a CMOS inverter.

Parasitic drain-node resistance greatly impacts semiconductor device performance. Thus, during semiconductor device layout and design, finding ways to minimize parasitic drain node resistance is very important. However, a conventional layout used to connect a multi-finger NFET and a multi-finger PFET can result in a relatively large drain-node wire resistance.

There remains a need to improve the layout design of a multi-finger CMOS inverter, which uses a multi-finger NFET and a multi-finger PFET, to reduce the parasitic drain-node wire resistance and thus, maximize current output of the multi-finger CMOS inverter.

SUMMARY

In view of the foregoing, the disclosure may provide a computer-implemented method of designing a layout of a multi-finger CMOS inverter for maximal drain current. The method may include disposing a multi-finger N-type field effect transistor (NFET), having $n_f$ fingers, proximate to a multi-finger P-type field effect transistor (PFET), also having $n_f$ fingers, in the layout, where the $n_f$ fingers contact multiple parallel gates of a common gate for each multi-finger NFET and multi-finger PFET, and where the multiple parallel gates separate multiple drains and multiple sources that are aligned for each multi-finger NFET and multi-finger PFET. The method may also include disposing a first metallization wire, along a length of the multi-finger NFET in the layout, in which the first metallization wire connects the multiple drains and contacts every drain of the multi-finger NFET. The method may further include disposing a second metallization wire, along a length of the multi-finger PFET in the layout, in which the second metallization wire connects the multiple drains and contacts every drain of the multi-finger PFET. The method may yet further include connecting a third metallization wire to the first and the second metallization wires at common output nodes for drain currents from the multi-finger NFET and the multi-finger PFET, respectively, in the layout, based on calculations of a minimal wiring resistance to the output nodes using: a total number of drains of the multi-finger NFET and the multi-finger PFET, and one of: a disposition of one outer drain along an outer width of each multi-finger NFET and multi-finger PFET, and of at least one inner drain between two sources of each multi-finger NFET and multi-finger PFET; and a disposition of no outer drains along outer widths of each multi-finger NFET and multi-finger PFET, and of at least two inner drains, each being disposed between two sources, of each multi-finger NFET and multi-finger PFET.

The disclosure may also provide a computer system for designing a layout of a multi-finger CMOS inverter for maximal drain current. The system includes a memory storing a number of fingers, $n_f$, of a multi-finger N-type field effect transistor (NFET) and of a multi-finger P-type field effect transistor (PFET), also having $n_f$ fingers, in the multi-finger CMOS inverter. The system also includes a processor that disposes the multi-finger NFET proximate to the multi-finger PFET in the layout, where the $n_f$ fingers contact multiple parallel gates of a common gate for each multi-finger NFET and multi-finger PFET, in which the multiple parallel gates separate multiple drains and multiple sources that are aligned for each multi-finger NFET and multi-finger PFET. The processor also disposes a first metallization wire along a length of the multi-finger NFET in the layout, where the first metallization wire connects the multiple drains and contacts every drain of the multi-finger NFET. The processor further disposes a second metallization wire along a length of the multi-finger PFET in the layout, where the second metallization wire connects multiple drains and contacts every drain of the multi-finger PFET. The processor further connects a third metallization wire to the first and the second metallization wires at common output nodes for drain currents from the multi-finger NFET and the multi-finger PFET, respectively, in the layout, based on calculations of a minimal wiring resistance to the output nodes using: a total number of drains of the multi-finger NFET and the multi-finger PFET, and one of: a disposition of one outer drain along an outer width of each multi-finger NFET and multi-finger PFET, and of at least one inner drain between two sources of each multi-finger NFET and multi-finger PFET; and a disposition of no outer drains along outer widths of each multi-finger NFET and multi-finger PFET, and of at least two inner drains, each being disposed between two sources, of each multi-finger NFET and multi-finger PFET.

The disclosure may also provide a tangible computer program product readable by computer, tangibly embodying a program of instructions executable by the computer to perform a method of designing a layout of a multi-finger CMOS inverter for maximal drain current. The method may include disposing a multi-finger N-type field effect transistor (NFET), having $n_f$ fingers, proximate to a multi-finger P-type field effect transistor (PFET), also having $n_f$ fingers, in the layout, where the $n_f$ fingers contact multiple parallel gates of a common gate for each multi-finger NFET and multi-finger PFET, and where the multiple parallel gates separate multiple drains and multiple sources that are aligned for each multi-finger NFET and multi-finger PFET. The method may also include disposing a first metallization wire, along a length of the multi-finger NFET in the layout, in which the first metallization wire connects the multiple drains and contacts every drain of the multi-finger NFET. The method may further include disposing a second metallization wire, along a length of the multi-finger PFET in the layout, in which the second metallization wire connects the multiple drains and contacts every drain of the multi-finger PFET. The method may yet further include connecting a third metallization wire to the first and the second metallization wires at common output nodes for drain currents from the multi-finger NFET and the multi-finger PFET, respectively, in the layout, based on calculations of a minimal wiring resistance to the output nodes using: a total number of drains of the multi-finger NFET and the multi-finger PFET, and one of: a disposition of one outer drain along an outer width of each multi-finger NFET and multi-finger PFET, and of at least one inner drain between two sources of each multi-finger NFET and multi-finger PFET; and a disposition of no outer drains along outer widths of each multi-finger NFET and multi-finger PFET, and of at least two inner drains, each being disposed between two sources, of each multi-finger NFET and multi-finger PFET.

BRIEF DESCRIPTION OF THE DRAWINGS

The methods, systems and computer program products herein will be better understood from the following detailed description with reference to the drawings, which are not necessarily drawn to scale and in which:

FIG. 2A is a schematic diagram illustrating a layout of a 3-finger CMOS inverter with a common output node disposed in a first location for a method, a system and a product FIG. 2B is a schematic diagram illustrating a layout of a 3-finger CMOS inverter with a common output node disposed in a second location for a method, a system and a product;

FIG. 2C is a schematic diagram illustrating a layout of a 3-finger CMOS inverter with a common output node disposed in a third location for a method, a system and a product;

FIG. 3A is a schematic of a model for analysis of the 3-finger CMOS inverter of FIG. 2A for a method, a system and a product;

FIG. 3B is a schematic of a model for analysis of the 3-finger CMOS inverter of FIG. 2B for a method, a system and a product;

FIG. 3C is a schematic of a model for analysis of the 3-finger CMOS inverter of FIG. 2C for a method, a system and a product;

FIG. 4A is a schematic diagram illustrating a layout of a 4-finger CMOS inverter with a common output node disposed in a first location for a method, a system and a product;

FIG. 4B is a schematic diagram illustrating a layout of a 4-finger CMOS inverter with a common output node disposed in a second location for a method, a system and a product;

FIG. 4C is a schematic diagram illustrating a layout of a 4-finger CMOS inverter with a common output node disposed in a third location for a method, a system and a product;

FIG. 5A is a schematic of a model for analysis of the 4-finger CMOS inverter of FIG. 4A for a method, a system and a product;

FIG. 5B is a schematic of a model for analysis of the 4-finger CMOS inverter of FIG. 4B for a method, a system and a product;

FIG. 5C is a schematic of a model for analysis of the 4-finger CMOS inverter of FIG. 4C for a method, a system and a product;

FIG. 6A is a schematic diagram illustrating a layout of a 5-finger CMOS inverter with a common output node disposed in a first location for a method, a system and a product;

FIG. 6B is a schematic diagram illustrating a layout of a 5-finger CMOS inverter with a common output node disposed in a second location for a method, a system and a product;

FIG. 6C is a schematic diagram illustrating a layout of a 5-finger CMOS inverter with a common output node disposed in a third location for a method, a system and a product;

FIG. 8A is a schematic diagram illustrating a layout of a 6-finger CMOS inverter with a common output node disposed in a first location for a method, a system and a product;

FIG. 8B is a schematic diagram illustrating a layout of a 6-finger CMOS inverter with a common output node disposed in a second location for a method, a system and a product;

FIG. 8C is a schematic diagram illustrating a layout of a 6-finger CMOS inverter with a common output node disposed in a third location for a method, a system and a product;

FIG. 9A is a schematic of a model for analysis of the 6-finger CMOS inverter of FIG. 8A for a method, a system and a product;

FIG. 9B is a schematic of a model for analysis of the 6-finger CMOS inverter of FIG. 8B for a method, a system and a product;

FIG. 9C is a schematic of a model for analysis of the 6-finger CMOS inverter of FIG. 8C for a method, a system and a product;

FIG. 10A is a schematic diagram illustrating a layout of a 7-finger CMOS inverter with a common output node disposed in a first location for a method, a system and a product;

FIG. 10B is a schematic diagram illustrating a layout of a 7-finger CMOS inverter with a common output node disposed in a second location for a method, a system and a product;

FIG. 10C is a schematic diagram illustrating a layout of a 7-finger CMOS inverter with a common output node disposed in a third location for a method, a system and a product;

FIG. 10D is a schematic diagram illustrating a layout of a 7-finger CMOS inverter with a common output node disposed in a fourth location for a method, a system and a product;

DETAILED DESCRIPTION

Figure 1B:
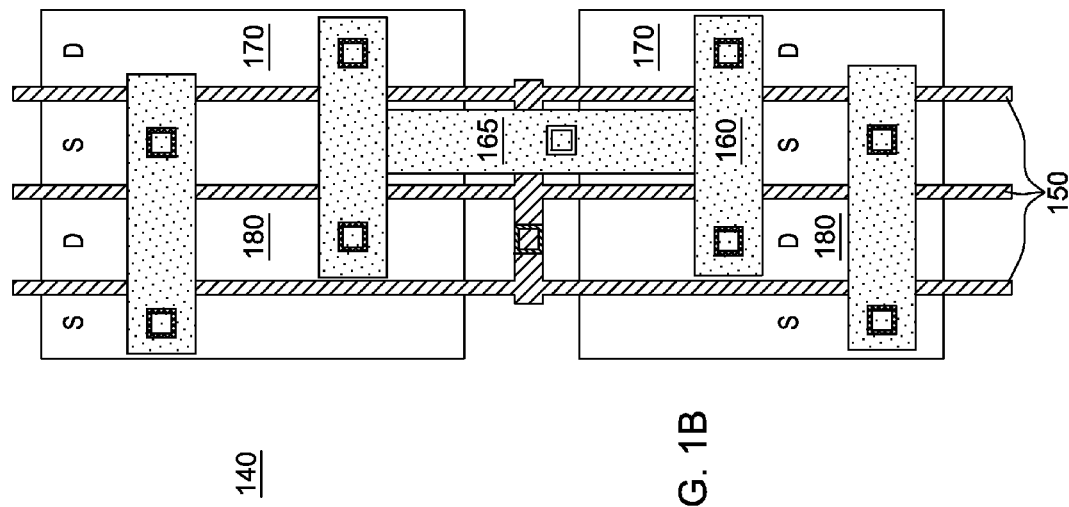
FIG. 1B is a schematic diagram illustrating a layout of a multi-finger CMOS inverter in the related art.

The exemplary methods, systems and products of the disclosure and their various features and advantageous details are explained more fully with reference to the non-limiting exemplary methods, systems and products that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary methods, systems and products of the disclosure. The examples used herein are intended to merely facilitate an understanding of ways in which the exemplary methods, systems and products of the disclosure may be practiced and to further enable those of skill in the art to practice the exemplary methods, systems and products of the disclosure. Accordingly, the examples should not be construed as limiting the scope of the exemplary methods, systems and products of the disclosure.

As stated above, there remains a need to reduce the total parasitic drain-node resistance of a multi-finger NFET and a multi-finger PFET of a CMOS inverter, to maximize current output of the CMOS inverter.

Figure 1A:
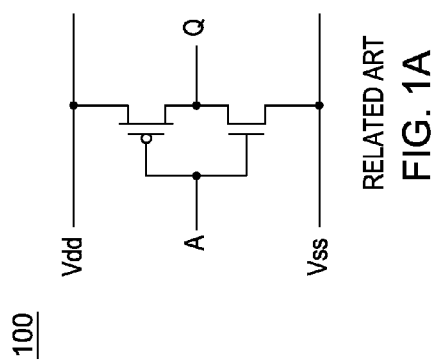
FIG. 1A is a schematic diagram of a CMOS inverter in the related art.

FIG. 1A of the related art illustrates a schematic diagram of a CMOS inverter 100 with a common input, A, to the gates of two complementary MOS transistors connected in series, and a common output, Q, connected to the two drains of the complementary MOS transistors.

FIG. 1B of the related art illustrates a schematic diagram of a multi-finger CMOS inverter 140 including a single common gate contact CA to multiple parallel fingers 150 of the common gate that extends across the width of each type of MOS transistor of the CMOS inverter 140. The drains, D, and sources, S, of each type of MOS transistor are aligned, and form contacts to first and second metallization wires 160, disposed along lengths of each type of MOS transistor. In FIG. 1B, the drains and sources of each type of MOS transistor are, for example, vertically-aligned; however, if the layout were rotated 90°, the drains and sources of each type of MOS transistor would be horizontally-aligned. As would be obvious to one of ordinary skill in the art, the drains and sources of each type of MOS transistor are aligned when the longitudinal axes of the individual drains and sources of each type of MOS transistor share common individual axes. A third metallization wire 165 that is formed between common output nodes along lengths of each of the first and second metallization wires 160 of each type of MOS transistor, connects all of the output drains of the two complementary MOS transistors and carries the output current of the multi-finger CMOS inverter 140.

As also shown by FIG. 1B, the drain, D, disposed on the right side of each type of MOS transistor forms an outer drain 170 that receives a gate-controlled current from the single adjacent source, S, to the left of the outer drain 170. Whereas, the drain disposed toward the left side of each type of MOS transistor forms an inner drain 180 that receives gate-controlled currents from the two sources, S, adjacent to the inner drain 180 on each side.

The inventor has shown in U.S. Patent Application No. 2012/0311518 A1 and U.S. Patent Application No. 2012/0254820, the respective subject matters of which are incorporated herewith, that the total drain-node resistance, $R_d$, to current flow through a wire partitioned into multiple segments for a multi-fingered semiconductor device may be expressed as:

$$R_d = \frac{1}{I_{d,tot}^2}\sum_k I_{d,k}^2 R_{d,k} = \frac{1}{n_f^2}\sum_k n_{d,k}^2 R_{d,k} \quad (1)$$

where $I_{d,tot}$ comprises the total drain electric current of a multi-finger NFET or PFET, $I_{d,k}$ equals the electric current through the kth segment of the wire, and $R_{d,k}$ equals the drain-node resistance of the kth segment of the wire.

Referring to FIGS. 2A, 2B and 2C, a multi-finger CMOS inverter comprising 3 fingers illustrates three possible layouts for a third metallization wire 265 that connects the drain regions of the NFET and the drain regions of the PFET of the 3-finger CMOS inverters 210, 220, 230. The intersection location of the third wire to the first wire forms the common output node of the first FET, e.g., the NFET, and the intersection point of the third wire to the second wire forms the common output node of the second FET, e.g., the PFET. The 3-finger CMOS inverter has one outer drain 270 and one inner drain 280. The pair of the first and second metallization wires 260 of the MOS transistors of the 3-finger CMOS inverters 210, 220, 230 may provide three possible low wire-to-gate-capacitance locations where the first metallization wire of the NFET and the second metallization wire of the PFET are connected using a third wire whose length is shortest: above inner drains 280, above the sources disposed between outer drains 270 and inner drains 280, and above outer drains 270, respectively. FIG. 2A shows that the third metallization wire 265, which is formed between the common output nodes of each type of MOS transistor of the 3-finger CMOS inverter 210, is positioned at locations of the first and second metallization wires 260 above inner drains 280 of each type of MOS transistor. FIG. 2B shows that the third metallization wire 265, which is formed between the common output nodes of each type of MOS transistor of the 3-finger CMOS inverter 220, is positioned at locations of the first and second metallization wires 260 above the source disposed between inner drain 280 and outer drain 270 of each type of MOS transistor; while FIG. 2C shows that the third metallization wire 265, which is formed between the common output nodes of each type of MOS transistor of the 3-finger CMOS inverter 230, is positioned at locations of the first and second metallization wires 265 above outer drains 270 of each type of MOS transistor.

Each of FIGS. 3A, 3B, and 3C calculates a relative value for the total drain-node resistance, $R_d$, of each type of MOS transistor of the 3-finger CMOS inverters illustrated by FIGS. 2A, 2B, and 2C, respectively.

FIG. 3A shows that the relative current (1 unit) from the diffusion region of outer drain 270, which is adjacent to a single source, travels through the rightmost wire segment of the metallization wire 260, and through the middle wire segment of the metallization wire 260 to the leftmost wire segment of the metallization wire 260 that connects to the common output node and the third metallization wire 265 of the 3-finger CMOS inverter 210 in FIG. 2A. Each wire segment may be characterized by a critical poly pitch (CPP) for the particular technology node used, which is equal to half the spacing between identical design elements, and may correspond to the segmental lengths of the sources and drains of a multi-finger CMOS inverter. In FIG. 3A, the length of the rightmost wire segment is one CPP, and the length of the middle wire segment is one CPP. In FIG. 3A, the relative current from the diffusion region of inner drain 280, which is positioned between two sources, directly contacts the leftmost wire segment of the metallization wire 260 and does not pass through a wire segment to connect to the common output node and the third metallization wire.

Thus, the relative value for the total drain-node resistance, $R_d$, of each type of MOS transistor corresponding to FIG. 2A, is equal to $2R_{M1,CPP}$, resulting from a sum of two products. The first product results from (i) the square of one unit of relative current from the diffusion region of outer drain 270, and (ii) the resistance of the rightmost wire segment through which the current travels. The length of the rightmost wire segment is one CPP with a resistance of one $R_{M1,CPP}$. The second product results from (i) the square of the same one unit of relative current from the diffusion region of outer drain 270, and (ii) the resistance of the middle wire segment through which the current travels to the leftmost segment of the metallization wire 260 that connects to the common output node and the third metallization wire 265 of the 3-finger CMOS inverter 210. The length of the middle wire segment is also one CPP with a resistance of one $R_{M1,CPP}$.

FIG. 3B shows that the relative current (1 unit) from the diffusion region of outer drain 270, which is adjacent to a single source, travels through the rightmost wire segment of the metallization wire 260 to the middle wire segment of the metallization wire 260 that connects to the common output node and the third metallization wire 265 of the 3-finger CMOS inverter 220. FIG. 3B also shows that the relative current (2 units) from the diffusion region of inner drain 280, which is positioned between two sources, travels through the leftmost wire segment of the metallization wire 260, which has a length of one CPP, to the middle wire segment of the metallization wire 260 that connects to the common output node and the third metallization wire 265 of the 3-finger CMOS inverter 220.

Thus, the relative value for the total drain-node resistance, $R_d$, of each type of MOS transistor corresponding to FIG. 2B is equal to $5R_{M1,CPP}$, resulting from a sum of two products. The first product results from (i) the square of two units of relative current from the diffusion region of inner drain 280, and (ii) the resistance of the leftmost wire segment through which the current travels to the middle segment of the metallization wire 260 that connects to the common output node and the third metallization wire 265. The length of the leftmost wire segment is one CPP with a resistance of one $R_{M1,CPP}$. The second product results from (i) the square of one unit of relative current from the diffusion region of outer drain 270, and (ii) the resistance of the rightmost wire segment through which the current travels to the middle segment of the metallization wire 260 that connects to the common output node and the third metallization wire 265 of the 3-finger CMOS inverter 220. The length of the rightmost wire segment is also one CPP with a resistance of one $R_{M1,CPP}$.

FIG. 3C shows that the relative current (2 units) from the diffusion region of inner drain 280, which is positioned between two sources, travels through the leftmost wire segment of the metallization wire 260, and through the middle wire segment of the metallization wire 260 to the rightmost segment of the metallization wire 260 that connects to the common output node and the third metallization wire 265 of the 3-finger CMOS inverter 230. The lengths of the leftmost wire segment and the middle wire segment are each one CPP. In FIG. 3C, the relative current from the diffusion region of outer drain 270 directly contacts the rightmost wire segment of the metallization wire 260 and does not pass through a wire segment to connect to the common output node.

Thus, the relative value for the total drain-node resistance, $R_d$, of each type of MOS transistor corresponding to FIG. 2C is equal to $8R_{M1,CPP}$, resulting from a sum of two products. The first product results from (i) the square of two units of relative current from the diffusion region of inner drain 280, and (ii) the resistance of the leftmost wire segment through which the current travels. The length of the leftmost wire segment is one CPP with a resistance of one $R_{M1,CPP}$. The second product results from (i) the square of the same two units of relative current from the diffusion region of inner drain 280, and (ii) the resistance of the middle wire segment through which the current travels to the rightmost segment of the metallization wire 260 that connects to the common output node and the third metallization wire 265 of the 3-finger CMOS inverter 230. The length of the middle wire segment is also one CPP with a resistance of $R_{M1,CPP}$.

For the 3-finger CMOS inverter of FIGS. 2A, 2B and 2C, the total number of drains is an even number, e.g., 2; there is a single outer drain 270; and the number of inner drains is odd, e.g., 1. In this case, a common output node that is located at each of the first and second metallization wires 260 above the inner drains 280 for each type of transistor, will minimize drain region's parasitic wire resistance and thus, will maximize output current for the 3-finger CMOS inverter. That the layout of FIG. 2A has the lowest wire capacitance is counter-intuitive. Generally, for a multi-finger CMOS inverter, where the number of fingers may equal (4k+3) and k equals 0, 1, 2, . . . , where the total number of drains is even, where there is an outer drain and where the number of inner drains is odd, the common output node may be located at the segment of each of the metallization wires of each type of MOS transistor above a central drain of the odd number of inner drains to minimize drain region's parasitic wire resistance and thus, to maximize output current for the (4k+3)-finger CMOS inverter.

Referring to FIGS. 4A, 4B and 4C, a multi-finger CMOS inverter comprising 4 fingers illustrates three possible layouts for a third metallization wire 465 that is formed between the common output nodes of each type of MOS transistor of each of the 4-finger CMOS inverters 410, 420, 430. In this case, each of the 4-finger CMOS inverters 410, 420, 430 has an even number of drains, e.g., 2, that includes two inner drains, each of which is positioned between two sources on each side. The pair of the first and second metallization wires 460 of the MOS transistors of the 4-finger CMOS inverters 410, 420, 430 may provide three possible low wire-to-gate-capacitance locations, where the first metallization wire of the NFET and the second metallization wire of the PFET are connected using a third wire whose length is shortest: above left inner drains 480, above the sources disposed between the two inner drains 480, 481, and above right inner drains 481. FIG. 4A shows that the third metallization wire 465, which is formed between the common output nodes of each type of MOS transistor of the 4-finger CMOS inverter 410, is positioned at locations of the first and second metallization wires 460 above inner drains 480 of each type of MOS transistor. FIG. 4B shows that the third metallization wire 460, which is formed between the common output nodes of each type of MOS transistor of the 4-finger CMOS inverter 420, is positioned at locations of the first and second metallization wires 460 above the sources disposed between inner drains 480 and inner drains 481 of each type of MOS transistor; while FIG. 4C shows that the third metallization wire 465, which is formed between the common output nodes of each type of MOS transistor of the 4-finger CMOS inverter 430, is positioned at locations of the first and second metallization wires 460 above inner drains 481 of each type of MOS transistor.

Each of FIGS. 5A, 5B, and 5C calculates a relative value for the total drain-node resistance, $R_d$, of each type of MOS transistor of the 4-finger CMOS inverters illustrated by FIGS. 4A, 4B, and 4C, respectively.

FIG. 5A shows that the relative current (2 units) from the diffusion region of inner drain 480, which is positioned between two sources, directly contacts the leftmost wire segment of the metallization wire 460 and does not pass through a wire segment to connect to the common output node and the third metallization wire 465. FIG. 5A also shows that the relative current (2 units) from the diffusion region of inner drain 481, which is positioned between two sources, travels through the rightmost wire segment of the metallization wire 460 and through the middle wire segment of the metallization wire 460 to the leftmost wire segment of the metallization wire 460 that connects to the common output node and the third metallization wire 465. The lengths of the rightmost wire segment and the middle wire segment are each one CPP.

Thus, the relative value for the total drain-node resistance, $R_d$, of each type of MOS transistor corresponding to FIG. 5A is equal to $8R_{M1,CPP}$, resulting from a sum of two products. The first product results from (i) the square of two units of relative current from the diffusion region of inner drain 481, and (ii) the resistance of the rightmost wire segment through which the current travels. The length of the rightmost wire segment is one CPP with a resistance of one $R_{M1,CPP}$. The second product results from (i) the square of the same two units of relative current from the diffusion region of inner drain 481, and (ii) the resistance of the middle wire segment through which the current travels to the leftmost wire segment of the metallization wire 460 that connects to the common output node and the third metallization wire 465. The length of the middle wire segment is also one CPP with a resistance of one $R_{M1,CPP}$.

FIG. 5B shows that the relative current (2 units) from the diffusion region of inner drain 480, which is positioned between two sources, travels through the leftmost wire segment of the metallization wire 460, which has a length of one CPP, to the middle wire segment of the metallization wire 460 that connects to the common output node and the third metallization wire 465 of the 4-finger CMOS inverter 420. FIG. 5B also shows that the relative current (2 units) from the diffusion region of inner drain 481, which is positioned between two sources, travels through the rightmost wire segment of the metallization wire 460, to the middle wire segment of the metallization wire 460 that connects to the common output node and the third metallization wire 465 of the 4-finger CMOS inverter 420. The length of the rightmost wire segment is also one CPP.

Thus, the relative value for the total drain-node resistance, $R_d$, of each type of MOS transistor corresponding to FIG. 5B is equal to $8R_{M1,CPP}$, resulting from a sum of two products. The first product results from (i) the square of two units of relative current from the diffusion region of inner drain 480, and (ii) the resistance of the leftmost wire segment through which the current travels to the middle wire segment of the metallization wire 460 that directly connects to the common output node and the third metallization wire 465. The length of the leftmost wire segment is one CPP with a resistance of one $R_{M1,CPP}$. The second product results from (i) the square of two units of relative current from the diffusion region of inner drain 481, and (ii) the resistance of the rightmost wire segment through which the current travels to the middle wire segment of the metallization wire 460 that directly connects to the common output node and the third metallization wire 465 of the 4-finger CMOS inverter 420. The length of the rightmost wire segment is also one CPP with a resistance of one $R_{M1,CPP}$.

FIG. 5C shows that the relative current (2 units) from the diffusion region of inner drain 480, travels through the leftmost wire segment of the metallization wire 460 and through the middle wire segment of the metallization wire 460 to the rightmost wire segment of the metallization wire 460 that connects to the common output node and the third metallization wire 465. The lengths of the leftmost wire segment and the middle wire segment are each one CPP. In FIG. 5C, the relative current from the diffusion region of inner drain 481 directly contacts the rightmost wire segment of the metallization wire 260 and does not pass through a wire segment to connect to the common output node and the third metallization wire 465.

Thus, the relative value for the total drain-node resistance, $R_d$, of each type of MOS transistor corresponding to FIG. 5C is equal to $8R_{M1,CPP}$, resulting from a sum of two products. The first product results from (i) the square of two units of relative current from the diffusion region of inner drain 480, and (ii) the resistance of the leftmost wire segment through which the current travels. The length of the leftmost wire segment is one CPP with a resistance of one $R_{M1,CPP}$. The second product results from (i) the square of the same two units of relative current from the diffusion region of inner drain 480, and (ii) the resistance of the middle wire segment through which the current travels to the rightmost wire segment of the metallization wire 460 that connects to the common output node and the third metallization wire 465 of the 4-finger CMOS inverter 430. The length of the middle wire segment is also one CPP with a resistance of one $R_{M1,CPP}$.

For the 4-finger CMOS inverter of FIGS. 4A, 4B and 4C, the total number of drains is even, i.e., 2, and all of the drains are inner drains. In this case, a common output node for each type of MOS transistor that is located at any of three low wire-to-gate-capacitance positions of the first and second metallization wires 460 above either of the two middle inner drains, i.e., 480 and 481, and above the sources between the two middle inner drains, i.e., 480 and 481, will minimize drain region's parasitic wire resistance and thus, will maximize output current for the 4-finger CMOS inverter. Generally, for a multi-finger CMOS inverter, where the number of fingers may equal a multiple of 4, where the number of drains is even and all drains are inner drains, the common output node may be located at any of locations of each of the metallization wires of each type of MOS transistor above either of two middle inner drains and above a position between the two middle inner drains to minimize drain region's parasitic wire resistance and thus, maximize output current for the (4k)-finger CMOS inverter, where k equals 1, 2, . . . .

Referring to FIGS. 6A, 6B and 6C, a multi-finger CMOS inverter comprising 5 fingers illustrates three possible layouts for a third metallization wire 665 that is formed between the common output nodes of each type of MOS transistor of each of the 5-finger CMOS inverters 610, 620, 630. In this case, the 5-finger CMOS inverter has a total number of 3 drains, including one outer drain located along an outer length of each type of MOS transistor and two inner drains, each being positioned between two sources. The pair of the first and second metallization wires 660 of each type of MOS transistor of the 5-finger CMOS inverters 610, 620, 630 may provide at least three possible low wire-to-gate-capacitance locations for the third metallization wire 665: above the inner drains 680 on the left hand side, above the inner drains 681, and above the outer drains 670. FIG. 6A shows that the third metallization wire 665, which is formed between the common output nodes of each type of MOS transistor of the 5-finger CMOS inverter 610, is positioned at the leftmost wire segment of the first and second metallization wires 660, above inner drains 680 of each type of MOS transistor. FIG. 6B shows that the third metallization wire 665, which is formed between the common output nodes of each type of MOS transistor of the 5-finger CMOS inverter 620, is positioned at the middle wire segment of the first and second metallization wires 660, above inner drains 681 of each type of MOS transistor; while FIG. 6C shows that the third metallization wire 665, which is formed between the common output nodes of each type of MOS transistor of the 5-finger CMOS inverter 630, is positioned at the rightmost wire segment of the first and second metallization wires 660, above outer drains 670 of each type of MOS transistor.

Figure 7B:
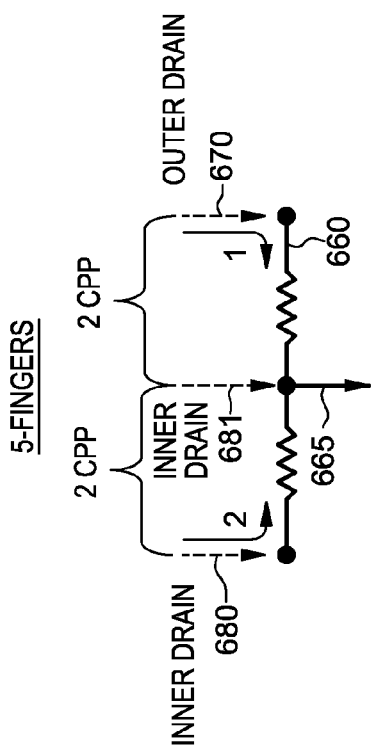
FIG. 7B is a schematic of a model for analysis of the 5-finger CMOS inverter of FIG. 6B for a method, a system and a product.
Figure 7C:
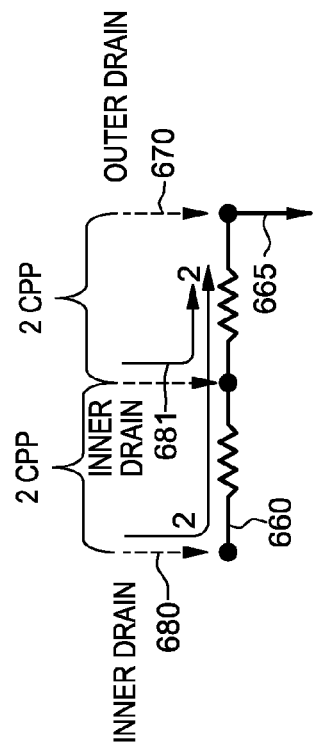
FIG. 7C is a schematic of a model for analysis of the 5-finger CMOS inverter of FIG. 6C for a method, a system and a product.
Figure 7A:
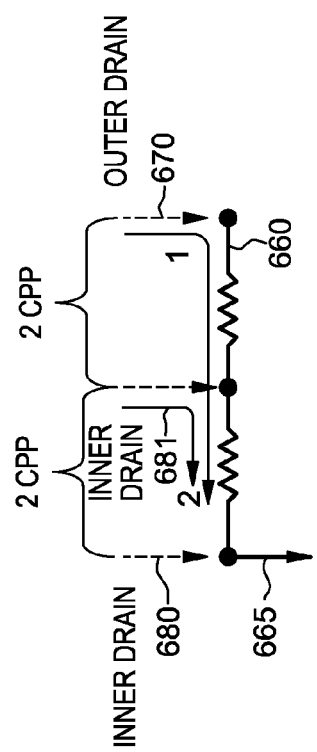
FIG. 7A is a schematic of a model for analysis of the 5-finger CMOS inverter of FIG. 6A for a method, a system and a product.

Each of FIGS. 7A, 7B, and 7C calculates a relative value for the total drain-node resistance, $R_d$, of each type of MOS transistor of the 5-finger CMOS inverters illustrated by FIGS. 6A, 6B, and 6C, respectively.

FIG. 7A shows that the relative current (1 unit) from the diffusion region of outer drain 670, which is adjacent to a single source, travels through the rightmost wire segment of the metallization wires 660 with a length of two CPP across outer drain 670 and the source between outer drain 670 and inner drain 681, and through the middle wire segment of the metallization wires 660 with a length of two CPP across inner drain 681 and the source between inner drain 681 and inner drain 680), to the leftmost wire segment of the metallization wire 660, which is above inner drain 680 and directly connects to the common output nodes of each type of MOS transistor and the third metallization wire 665 of the 5-finger CMOS inverter 610. FIG. 7A also shows that the relative current (2 units) from the diffusion region of inner drain 681, which is positioned between two sources, travels through the middle wire segment of the metallization wires 660 with a length of two CPP across inner drain 681 and the source between inner drain 681 and inner drain 660), to the leftmost wire segment of the metallization wire 660, which directly connects to the common output node of each type of MOS transistor and the third metallization wire 665 of the 5-finger CMOS inverter 610. FIG. 7A further shows that the relative current from the diffusion region of inner drain 480 directly contacts the leftmost wire segment of the metallization wire 660 and does not pass through a wire segment to connect to the common output node and the third metallization wire 665.

Thus, the relative value for the total drain-node resistance, $R_d$, of each type of MOS transistor corresponding to FIG. 7A is equal to $20R_{M1,CPP}$ resulting from a sum of two products. The first product results from (i) the square of one unit of relative current from the diffusion region of outer drain 670, and (ii) the resistance of the rightmost wire segment through which the current travels. The length of the rightmost wire segment is two CPP with a resistance of $2R_{M1,CPP}$. The second product results from (i) the square of three units of relative current from the one unit of relative current from the diffusion region of outer drain 670 plus the two units of relative current from the diffusion region of inner drain 681, and (ii) the resistance of the middle wire segment through which the current travels to the leftmost wire segment of the metallization wire 660, which directly connects to the common output nodes of each type of MOS transistor and the third metallization wire 665 of the 5-finger CMOS inverter 610. The length of the middle wire segment is also two CPP with a resistance of $2R_{M1,CPP}$.

FIG. 7B shows that the relative current (2 units) from the diffusion region of inner drain 680, which is positioned between two sources, travels through the leftmost wire segment of the metallization wire 660 with a length of two CPP across inner drain 680 and the source between inner drains 680 and 681, to the middle wire segment of the metallization wire 660, which is above inner drain 681 and connects to the common output node of each type of MOS transistor and the third metallization wire 665 of the 5-finger CMOS inverter 620. FIG. 7B also shows that the relative current (2 units) from the diffusion region of outer drain 670, which is positioned between two sources, travels through the rightmost wire segment of the metallization wire 660 with a length of two CPP across outer drain 670 and the source between outer drain 670 and inner drain 681 to the middle wire segment of the metallization wire 660 that connects to the common output node of each type of MOS transistor and the third metallization wire 665 of the 5-finger CMOS inverter 620. FIG. 7B further shows that the relative current from the diffusion region of inner drain 681 directly contacts the middle wire segment of the metallization wire 660 and does not pass through a wire segment to connect to the common output node and the third metallization wire 665.

Thus, the relative value for the total drain-node resistance, $R_d$, of each type of MOS transistor corresponding to FIG. 7B is equal to $10R_{M1,CPP}$ resulting from a sum of two products. The first product results from (i) the square of two units of relative current from the diffusion region of inner drain 680, and (ii) the resistance of the leftmost wire segment through which the current travels to the middle wire segment of the metallization wire 660 that connects to the common output node of each type of MOS transistor and the third metallization wire 665. The length of the leftmost wire segment is two CPP with a resistance of $2R_{M1,CPP}$. The second products results from (i) the square of one unit of relative current from the diffusion region of outer drain 670, and (ii) the resistance of the rightmost wire segment through which the current travels to the middle wire segment of the metallization wire 660 that connects to the common output node of each type of MOS transistor and the third metallization wire 665 of the 5-finger CMOS inverter 620. The length of the rightmost wire segment is also two CPP with a resistance of $2R_{M1,CPP}$.

FIG. 7C shows that the relative current (2 units) from diffusion region of inner drain 680, which is positioned between two sources, travels through the leftmost wire segment of the metallization wire 660 with a length of two CPP across inner drain 680 and the source between inner drain 680 and inner drain 681, and through the middle wire segment of the metallization wire 660 with a length of two CPP across inner drain 681 and the source between inner drain 681 and outer drain 670, to the rightmost wire segment of the metallization wire 660, which directly connects to the common output node of each type of MOS transistor and the third metallization wire 665 of the 5-finger CMOS inverter 630.

FIG. 7C also shows that the relative current (2 units) from the diffusion region of inner drain 681, which is positioned between two sources, travels through the middle wire segment of the metallization wire 660 with a length of two CPP across inner drain 681 and the source between inner drain 681 and outer drain 670, to the rightmost wire segment of the metallization wire 660, which directly connects to the common output node of each type of MOS transistor and the third metallization wire 665 of the 5-finger CMOS inverter 630. FIG. 7C further shows that the relative current from the diffusion region of outer drain 670 directly contacts the rightmost wire segment of the metallization wire 660 and does not pass through a wire segment to connect to the common output node and the third metallization wire 665.

Thus, the relative value for the total drain-node resistance, $R_d$, of each type of MOS transistor corresponding to FIG. 7C is equal to $40R_{M1,CPP}$, resulting from a sum of two products. The first product results from (i) the square of two units of relative current from the diffusion region of inner drain 680, and (ii) the resistance of the leftmost wire segment through which the current travels. The length of the leftmost wire segment is two CPP with a resistance of $2R_{M1,CPP}$. The second product results from (i) the square of the same two units of relative current from the diffusion region of inner drain 680 plus the two units of relative current from the diffusion region of inner drain 681, and (ii) the resistance of the middle wire segment through which the current travels to the rightmost wire segment of the metallization wire 660, which directly connects to the common output node of each type of MOS transistor and the third metallization wire 665 of the 5-finger CMOS inverter 630. The length of the middle wire segment is also two CPP with a resistance of $2R_{M1,CPP}$.

Similar analyses for the relative value for the total drain-node resistance, $R_d$, of each type of MOS transistor, where the third metallization wire 665 is formed between the common output nodes positioned above each of either of the sources disposed between inner drains 680 and 681, and between inner drain 681 and outer drain 670 of each type of MOS transistor of a 5-finger CMOS inverter, reveal such total drain-node resistances, $R_d$, to be larger than the total drain-node resistance, $R_d$, corresponding to the selected layout of FIG. 7B.

For the 5-finger CMOS inverter of FIGS. 6A, 6B, and 6C, the total number of drains is odd, i.e., 3, and includes a single outer drain. In this case, a common output node for each type of MOS transistor that is located at a segment of each of the first and second metallization wires 660 above the length of the central drain, i.e., 681, of the total number of drains will maximize output current for the 5-finger CMOS inverter. Generally, for a multi-finger CMOS inverter, where the number of fingers may equal (4k+1) and k equals 1, 2, . . . , where the total number of drains is an odd number and where there is a single outer drain, the common output node for each type of MOS transistor may be located at a segment of each of the metallization wires of each type of MOS transistor above the central drain of the total number of drains to maximize output current for the (4k+1)-finger CMOS inverter.

Referring to FIGS. 8A, 8B and 8C, a multi-finger CMOS inverter comprising 6 fingers illustrates three possible layouts for a third metallization wire 865 that is formed between the common output nodes of each type of MOS transistor of each of the 6-finger CMOS inverters 810, 820, 830. In this case, each of the 6-finger CMOS inverters 810, 820, 830 has a total number of drains that is odd, where all of the drains are inner drains. The pair of the first and second metallization wires 860 of each type of MOS transistor of the 6-finger CMOS inverters 810, 820, 830 may provide at least three possible low wire-to-gate-capacitance locations for the third metallization wire 865: above inner drains 880 on the left hand side, above inner drains 881, and above inner drains 882 on the right hand side. FIG. 8A shows that the third metallization wire 865, which is formed between the common output nodes of each type of MOS transistor of the 6-finger CMOS inverter 610, is positioned at locations of the first and second metallization wires 860 above inner drains 880 of each type of MOS transistor. FIG. 8B shows that the third metallization wire 865, which is formed between the common output nodes of each of the MOS transistors of the 6-finger CMOS inverter 820, is positioned at locations of the first and second metallization wires 860 above inner drains 881 of each type of MOS transistor; while FIG. 8C shows that the third metallization wire 865, which is formed between the common output nodes of each type of MOS transistor of the 6-finger CMOS inverter 830, is positioned at locations of the first and second metallization wires 860 above inner drains 882 of each type of MOS transistor.

Each of FIGS. 9A, 9B, and 9C calculates a relative value for the total drain-node resistance, $R_d$, of each type of MOS transistor of the 6-finger CMOS inverters illustrated by FIGS. 8A, 8B, and 8C, respectively.

FIG. 9A shows that the relative current (2 units) from the diffusion region of inner drain 882, which is positioned between two sources, travels through the rightmost wire segment of the metallization wires 860 with a length of two CPP across inner drain 882 and the source between inner drain 882 and inner drain 881, and through the middle wire segment of the metallization wires 860 with a length of two CPP across inner drain 881 and the source between inner drain 881 and inner drain 880, to the leftmost wire segment of the metallization wires 860 that is positioned above inner drain 880 and directly connected to the common output nodes of the first and second metallization wires 860 of each type of MOS transistor and the third metallization wire of the 6-finger CMOS inverter 810. FIG. 9 A also shows that the relative current (2 units) from the diffusion region of inner drain 881, which is positioned between two sources, travels through the middle wire segment of the metallization wires 860, above the lengths of inner drain 881 and the length of the source between inner drain 881 and inner drain 880, to the leftmost wire segment of the metallization wires 860 that directly connects to the common output nodes of the first and second metallization wires 860 of each type of MOS transistor and the third metallization wire of the 6-finger CMOS inverter 810. FIG. 9A further shows that the relative current from the diffusion region of inner drain 880 directly contacts the leftmost wire segment of the metallization wire 660 and does not pass through a wire segment to connect to the common output node and the third metallization wire 865.

Thus, the relative value for the total drain-node resistance, $R_d$, of each type of MOS transistor corresponding to FIG. 9A is equal to $40R_{M1,CPP}$, resulting from a sum of two products. The first product results from (i) the square of two units of relative current from the diffusion region of inner drain 882, and (ii) the resistance of the rightmost wire segment of the metallization wire 860 through which the current travels. The length of the rightmost wire segment is two CPP with a resistance of $2R_{M1,CPP}$. The second product results from (i) the square of four units of relative current, i.e., two from the diffusion region of inner drain 882 plus two from inner drain 881, and (ii) the resistance of the middle wire segment of the metallization wire 860 through which the current travels to the leftmost wire segment of the metallization wires 860 that directly connects to the common output nodes of the first and second metallization wires 860 of each type of MOS transistor and the third metallization wire of the 6-finger CMOS inverter 810. The length of the middle wire segment is also two CPP with a resistance of $2R_{M1,CPP}$.

FIG. 9B shows that the relative current (2 units) from the diffusion region of inner drain 880, which is positioned between two sources, travels through the leftmost segment of the metallization wires 860 with a length of two CPP across inner drain 880 and the source between inner drain 880 and inner drain 881, to the middle wire segment of the metallization wires 860 that is above inner drain 881 and directly connects to the common output nodes of the first and second metallization wires 860 of each type of MOS transistor and the third metallization wire 865 of the 6-finger CMOS inverter 820. FIG. 9B also shows that the relative current (2 units) from the diffusion region of inner drain 881, which is positioned between two sources, directly contacts the middle wire segment of the metallization wires 860 and does not pass through a wire segment to connect to the common output node and the third metallization wire 865. FIG. 9B further shows that the relative current (2 units) from the diffusion region of inner drain 882, which is positioned between two sources, travels through the rightmost segment of the metallization wire 860 with a length of two CPP across inner drain 882 and the source between inner drain 882 and inner drain 881, to the middle wire segment of the metallization wires 860 that directly connects to the common output nodes of the first and second metallization wires 860 of each type of MOS transistor and the third metallization wire 865 of the 6-finger CMOS inverter 820. FIG. 9B further shows that the relative current from the diffusion region of inner drain 881 directly contacts the middle wire segment of the metallization wire 860 and does not pass through a wire segment to connect to the common output node and the third metallization wire 865.

Thus, the relative value for the total drain-node resistance, $R_d$, of each type of MOS transistor corresponding to FIG. 9B is equal to $16R_{M1,CPP}$, resulting from a sum of two products. The first product results from (i) the square of the two units of relative current from the diffusion region of inner drain 880 traveling through the leftmost wire segment of the metallization wires 860 to the middle wire segment of the metallization wires 860 that directly connects to the common output nodes of the first and second metallization wires 860 of each type of MOS transistor and the third metallization wire 865. The length of the leftmost wire segment is two CPP with a resistance of $2R_{M1,CPP}$. The second product results from (i) the square of the two units of relative current from the diffusion region of inner drain 882, and (ii) the resistance of the rightmost wire segment through which the current travels to the middle wire segment of the metallization wires 860 that directly connects to the common output nodes of the first and second metallization wires 860 of each type of MOS transistor and the third metallization wire 865 of the 6-finger CMOS inverter 820. The length of the rightmost wire segment is also two CPP with a resistance of $2R_{M1,CPP}$.

FIG. 9C shows that the relative current (2 units) from the diffusion region of inner drain 880, which is positioned between two sources, travels through the leftmost wire segment of the metallization wires 860 with a length of two CPP across inner drain 880 and the source between inner drain 880 and inner drain 881, and through the middle wire segment of the metallization wires 860 with a length of two CPP across inner drain 881 and the source between inner drain 881 and inner drain 882, to the rightmost wire segment of the metallization wires 860 that directly connects to the common output nodes of the first and second metallization wires 860 of each type of MOS transistor and the third metallization wire 865 of the 6-finger CMOS inverter 830. FIG. 9 C also shows that the relative current (2 units) from the diffusion region of inner drain 881, which is positioned between two sources, travels through the middle segment of the metallization wires 860 with a length of two CPP across inner drain 881 and the source between inner drain 881 and inner drain 882, to the rightmost wire segment of the metallization wire 860 that directly connects to the common output nodes of the first and second metallization wires 860 of each type of MOS transistor and the third metallization wire 865 of the 6-finger CMOS inverter 830. FIG. 9C further shows that the relative current from the diffusion region of inner drain 882 directly contacts the rightmost wire segment of the metallization wires 860 and does not pass through a wire segment to connect to the common output node and the third metallization wire 865.

Thus, the relative value for the total drain-node resistance, $R_d$, of each type of MOS transistor corresponding to FIG. 9C is equal to $40R_{M1,CPP}$, resulting from a sum of two products. The first product results from (i) the square of two units of relative current from the diffusion region of inner drain 880 traveling through the leftmost wire segment through which the current travels. The length of the leftmost wire segment is two CPP with a resistance of $2R_{M1,CPP}$. The second product results from (i), the square of four units of relative current i.e., two from the diffusion region of inner drain 880, plus two from inner drain 881, and (ii) the resistance of the middle wire segment through which the current travels to the rightmost wire segment of the metallization wires 860, which directly connects to the common output nodes of the first and second metallization wires 860 of each type of MOS transistor and the third metallization wire 865 of the 6-finger CMOS inverter 830. The length of the middle wire segment is also two CPP with a resistance of $2R_{M1,CPP}$.

Similar analyses for the relative value for the total drain-node resistance, $R_d$, of each type of MOS transistor, where the third metallization wire 865 is formed between the common output nodes positioned above each of either of the sources disposed between inner drains 880 and 881, and between inner drains 881 and 882 of each type of MOS transistor of a 6-finger CMOS inverter, reveal such total drain-node resistances, $R_d$, to be larger than the total drain-node resistance, $R_d$, corresponding to the selected layout of FIG. 8B.

For the 6-finger CMOS inverter of FIGS. 8A, 8B, and 8C, the total number of drains is odd, i.e., 3, and includes one outer drain. In this case, a common output node for each type of MOS transistor that is located at a segment of each of the first and second metallization wires 860 above the central drains, i.e., 881, of the number of inner drains will maximize output current for the 6-finger CMOS inverter. Generally, for a multi-finger CMOS inverter, where the number of fingers may equal (4k+2) and k equals 1, 2, . . . , where the total number of drains is odd, and all of the drains are inner drains, the common output node may be located at the segment of each of the metallization wires 860 of each type of MOS transistor above the central drain of all of the inner drains to maximize output current for the (4k+2)-finger CMOS inverter.

Referring to FIGS. 10A, 10B, 10C, and 10D a multi-finger CMOS inverter comprising 7 fingers illustrates four possible layouts for a third metallization wire 1065 that is formed between the common output nodes of each type of MOS transistor of each of the 7-finger CMOS inverters 1010, 1020, 1030 and 1040. In this case, each of the 7-finger CMOS inverters 1010, 1020, 1030 and 1040 has a total number of drains that is even, including one outer drain. The pair of the first and second metallization wires 1060 of each type of MOS transistor of the 7-finger CMOS inverters 1010, 1020, and 1040 may provide three possible low wire-to-gate-capacitance locations for the third metallization wire 1065, i.e., above inner drains 1080 on the left hand side, above inner drains 1081, and above outer drains 1070 on the right hand side for the 7-finger CMOS inverters 1010, 1020, and 1040, respectively. The pair of the first and second metallization wires 1060 of each type of MOS transistor of the 7-finger CMOS inverter 1030 may provide another possible low wire-to-gate-capacitance location for the third metallization wire 1065 above sources located between inner drains 1081 and 1082. FIG. 10A shows that the third metallization wire 1065, which is formed between the common output nodes of each type of MOS transistor of the 7-finger CMOS inverter 1010, is positioned at segments of the first and second metallization wires 1060 above inner drains 1080 of each of type of MOS transistor. FIG. 10B shows that the third metallization wire 1060, which is formed between the common output nodes of each type of MOS transistor of the 7-finger CMOS inverter 1020, is positioned at segments of the first and second metallization wires 1060 above inner drains 1081 of each of the MOS transistors. FIG. 10C shows that the third metallization wire 1065, which is formed between the common output nodes of each type of MOS transistor of the 7-finger CMOS inverter 1030, is positioned at segments of the first and second metallization wires 1060 above sources between inner drains 1081 and inner drains 1082 of each type of MOS transistor; while FIG. 10D shows that the third metallization wire 1065, which is formed between the common output nodes of each type of MOS transistor of the 7-finger CMOS inverter 1040, is positioned at segments of the first and second metallization wires 1060 above outer drains 1070 of each type of MOS transistor.

Each of FIGS. 11A, 11B, 11C and 11D calculates a relative value for the total drain-node resistance, $R_d$, of each type of MOS transistor of the 7-finger CMOS inverters illustrated by FIGS. 10A, 10B, 10C and 10D, respectively.

Figure 11A:
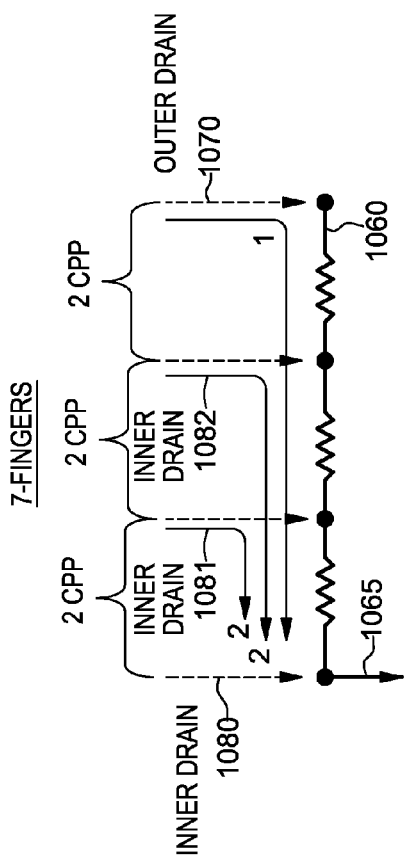
FIG. 11A is a schematic of a model for analysis of the 7-finger CMOS inverter of FIG. 10A for a method, a system and a product.

FIG. 11A shows that the relative current (1 unit) from the diffusion region of outer drain 1070, which is adjacent to a single source, travels through a first wire segment of the metallization wires 1060 with a length of two CPP across outer drain 1070 and the source between outer drain 1070 and inner drain 1082, through a second wire segment of the metallization wires 1060 with a length of two CPP across inner drain 1082 and the source between inner drain 1082 and inner drain 1081, and through a third wire segment of the metallization wires 1060 with a length of two CPP across inner drain 1081 and the source between inner drain 1081 and inner drain 1080, to a fourth wire segment of the metallization wires 1060 that directly connects to the common output nodes of the first and second metallization wires 1060 of each type of MOS transistor and the third metallization wire 1065 of the 7-finger CMOS inverter 1010. Each of the first, second, and third wire segments has a length of two CPP with a resistance of $2R_{M1,CPP}$. FIG. 11A also shows that the relative current (2 units) from the diffusion region of inner drain 1082, which is positioned between two sources, also travels through the second wire segment of the metallization wires 1060 with a length of two CPP across inner drain 1082 and the source between inner drain 1082 and inner drain 1081, and through the third wire segment of the metallization wires 1060 with a length of two CPP across inner drain 1081 and the source between inner drain 1081 and inner drain 1080, to the fourth wire segment of the metallization wires 1060 that directly connects to the common output nodes of the first and second metallization wires 1060 of each type of MOS transistor and the third metallization wire 1065 of the 7-finger CMOS inverter 1010. FIG. 11A further shows that the relative current (2 units) from inner drain 1081, which is positioned between two sources, also travels through the third wire segment of the metallization wires 1060 with a length of two CPP across inner drain 1081 and the source between inner drain 1081 and inner drain 1080, to the fourth wire segment of the metallization wires 1060 that directly connects to the common output nodes of the first and second metallization wires 1060 of each type of MOS transistor and the third metallization wire 1065 of the 7-finger CMOS inverter 1010. In FIG. 11A, the relative current from inner drain 1080 directly contacts the fourth wire segment of the metallization wire 1060 and does not pass through a wire segment to connect to the common output node.

Thus, the relative value for the total drain-node resistance, $R_d$, of each type of MOS transistor corresponding to FIG. 11A is equal to $70R_{M1,CPP}$, resulting from a sum of three products. The first product results from (i) the square of five units of relative current, i.e., one from the diffusion region of outer drain 1070, plus two from inner drain 1082, plus two from inner drain 1081, and (ii) the resistance of the third wire segment of the metallization wire 1060, through which the current travels to the fourth wire segment that directly connects to the common output nodes of the first and second metallization wires 1060 of each type of MOS transistor and the third metallization wire 1065 of the 7-finger CMOS inverter 1010. The length of the third wire segment is two CPP with a resistance of $2R_{M1,CPP}$. The second product results from (i) the square of three units of relative current, i.e., one from the diffusion region of outer drain 1070, plus two from inner drain 1082, and (ii) the resistance of the second wire segment of the metallization wire 1060 through which the current travels to the third wire segment. The length of the second wire segment is two CPP with a resistance of $2R_{M1,CPP}$. The third product results from (i) the square of one unit of relative drain current from the diffusion region of outer drain 1070, and (ii) the resistance of the fourth wire segment of the metallization wire 1060 across outer drain 1070 and the source between outer drain 1070 and inner drain 1082. The length of the fourth wire segment is two CPP with a resistance of $2R_{M1,CPP}$.

Figure 11B:
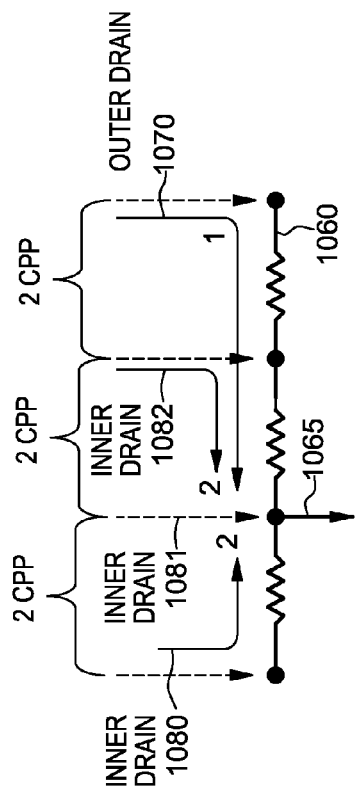
FIG. 11B is a schematic of a model for analysis of the 7-finger CMOS inverter of FIG. 10B for a method, a system and a product.

FIG. 11B shows that the relative current (2 units) from the diffusion region of inner drain 1080 travels through another first wire segment of the metallization wire 1060 with a length of two CPP across inner drain 1080 and the source between inner drain 1080 and inner drain 1081, to another second wire segment of the metallization wire 1060, above inner drain 1081, that directly connects to the common output nodes of the first and second metallization wires 1060 of each type of MOS transistor and the third metallization wire 1065 of the 7-finger CMOS inverter 1020. The relative current of the diffusion region of inner drain 1081 contacts the another second wire segment of the metallization wire 1060, which is directly connected to the common output node. FIG. 11B also shows that the relative current (2 units) of the diffusion region of inner drain 1082 travels through another third wire segment of the metallization wire 1060 with a length of two CPP across inner drain 1082 and the source between inner drain 1082 and inner drain 1081, to the another second segment of the metallization wire 1060, above inner drain 1081, that directly connects to the common output nodes of the first and second metallization wires 1060 of each type of MOS transistor and the third metallization wire 1065 of the 7-finger CMOS inverter 1020. FIG. 11B further shows that the relative current (1 unit) from the diffusion region of outer drain 1070 travels through another fourth segment of the metallization wire 1060 with a length of two CPP across outer drain 1070 and the source between outer drain 1070 and through the another third wire segment of the metallization wire 1060 with a length of two CPP, to the another second segment of the metallization wire 1060 that directly connects to the common output nodes of the first and second metallization wires 1060 of each type of MOS transistor and the third metallization wire 1065 of the 7-finger CMOS inverter 1020.

Thus, the relative value for the total drain-node resistance, $R_d$, of each type of MOS transistor corresponding to FIG. 11B is equal to $28R_{M1,CPP}$, resulting from a sum of three products. The first product results from (i) the square of two units of relative current from the diffusion region of inner drain 1080, and (ii) the resistance of another first wire segment of the metallization wire 1060 through which the current travels, to another second wire segment of the metallization wire 1060 that directly connects to the common output nodes of the first and second metallization wires 1060 of each type of MOS transistor and the third metallization wire 1065 of the 7-finger CMOS inverter 1020. The length of another first wire segment is two CPP with a resistance of $2R_{M1,CPP}$. The second product results from (i) the square of three units of relative current, i.e., two from inner drain 1082 plus one from outer drain 1070, and (ii) the resistance of another third segment of the metallization wire 1060 across inner drain 1082 and the source between inner drain 1082 and inner drain 1081 through which the current travels, to another second wire segment of the metallization wire 1060 that directly connects to the common output nodes of the first and second metallization wires 1060 of each type of MOS transistor and the third metallization wire 1065 of the 7-finger CMOS inverter 1020. The length of another third wire segment is two CPP with a resistance of $2R_{M1,CPP}$. The third product results from (i) the square of one unit of relative current from the diffusion region of outer drain 1070, and (ii) the resistance of another fourth wire segment of the metallization wire 1060 across outer drain 1070 and the source between outer drain 1070 and inner drain 1082 through which the current travels, to another third segment of the metallization wire 1060 of each type of MOS transistor in the 7-finger CMOS inverter 1020. The length of another fourth wire segment is two CPP with a resistance of $2R_{M1,CPP}$.

Figure 11C:
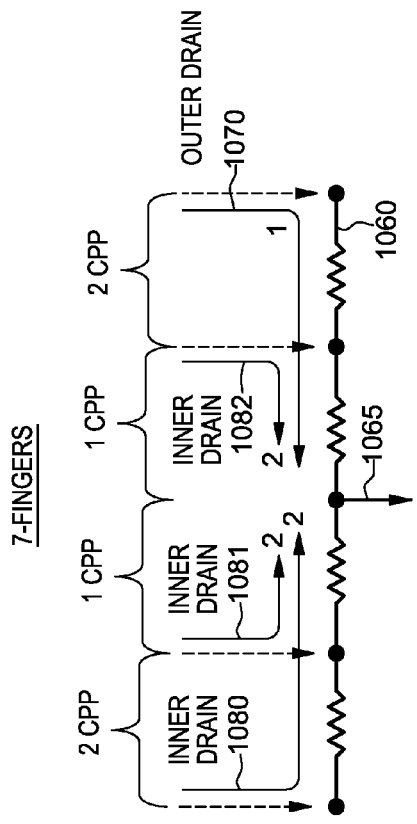
FIG. 11C is a schematic of a model for analysis of the 7-finger CMOS inverter of FIG. 10C for a method, a system and a product.

FIG. 11C shows that the relative current (2 units) from the diffusion region of inner drain 1080 travels through yet another first wire segment of the metallization wire 1060 with a length of two CPP across inner drain 1080 and the source between inner drain 1080 and inner drain 1081, and through yet another second wire segment of the metallization wire 1060 with a length of one CPP across inner drain 1081, to yet another third segment of the metallization wire 1060 with a length of one CPP across the source between inner drain 1081 and inner drain 1082 that directly connects to the common output nodes of the first and second metallization wires 1060 of each type of MOS transistor and the third metallization wire 1065 of the 7-finger CMOS inverter 1030. FIG. 11C also shows that the relative current (2 units) from the diffusion region of inner drain 1081 travels through the yet another second wire segment of the metallization wire 1060 with a length of one CPP across inner drain 1081, to the yet another third segment of the metallization wire 1060 that directly connects to the common output nodes of the first and second metallization wires 1060 of each type of MOS transistor and the third metallization wire 1065 of the 7-finger CMOS inverter 1030. FIG. 11C further shows that that the relative current (2 units) from inner drain 1082 travels through the yet another fourth segment of the metallization wire 1060 with a length of one CPP across inner drain 1082, to the yet another third segment of the metallization wire 1060 that directly connects to the common output nodes of the first and second metallization wires 1060 of each type of MOS transistor and the third metallization wire 1065 of the 7-finger CMOS inverter 1030. FIG. 11C yet further shows that the relative current of the diffusion region of outer drain 1070 travels through a fifth wire segment of the metallization wire 1060 with a length of two CPP across outer drain 1070 and the source between outer drain 1070 and inner drain 1082, and through the yet another fourth segment of the metallization wire 1060 with a length of one CPP across inner drain 1082, to the yet another third segment of the metallization wire 1060 that directly connects to the common output nodes of the first and second metallization wires 1060 of each type of MOS transistor and the third segment of the metallization wire 1065 of the 7-finger CMOS inverter 1030.

Thus, the relative value for the total drain-node resistance, $R_d$, of each type of MOS transistor corresponding to FIG. 11C is equal to $35R_{M1,CPP}$, resulting from a sum of four products. The first product results from (i) the square of two units of relative current from the diffusion region of inner drain 1080, and (ii) the resistance of the yet another first wire segment of the metallization wire 1060 across inner drain 1080 and the source between inner drain 1080 and inner drain 1081 through which the current travels, to the yet another second wire segment. The length of the yet another first wire segment is two CPP with a resistance of $2R_{M1,CPP}$. The second product results from (i) the square of four units of relative current, i.e., two from inner drain 1080, plus two from inner drain 1081, and (ii) the resistance of the yet another second wire segment of the metallization wire 1060 across inner drain 1081, to the yet another third wire segment of the metallization wire 1060 that directly connects to the common output nodes of the first and second metallization wires 1060 of each type of MOS transistor and the third metallization wire 1065 of the 7-finger CMOS inverter 1030. The length of the yet another second wire segment is one CPP with a resistance of $1R_{M1,CPP}$. The third product results from (i) the square of three units of relative current, i.e., two from inner drain 1082, plus one from outer drain 1070, and (ii) the resistance of the yet another fourth wire segment of the metallization wire 1060 across inner drain 1082, to the yet another third wire segment of the metallization wire 1060 that directly connects to the common output nodes of the first and second metallization wires 1060 of each type of MOS transistor and the third metallization wire 1065 of the 7-finger CMOS inverter 1030. The length of the yet another fourth wire segment is one CPP with a resistance of $1R_{M1,CPP}$. The fourth product results from (i) the square of one unit of relative current from the diffusion region of outer drain 1070, and (ii) the resistance of the fifth wire segment of the metallization wire 1060 across outer drain 1070 and the source between outer drain 1070 and inner drain 1082, to the yet another fourth wire segment. The length of the fifth wire segment is two CPP with a resistance of $2R_{M1,CPP}$.

Figure 11D:
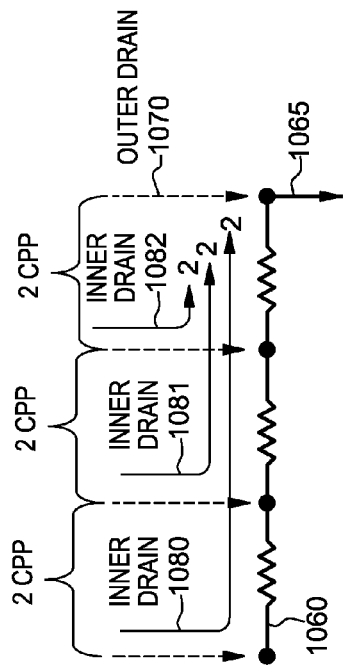
FIG. 11D is a schematic of a model for analysis of the 7-finger CMOS inverter of FIG. 10D for a method, a system and a product.

FIG. 11D shows that the relative current (2 units) of the diffusion region of inner drain 1080 travels through yet another first wire segment of the metallization wire 1060 with a length of two CPP across inner drain 1080 and the source between inner drain 1080 and inner drain 1081, through yet another second wire segment of the metallization wire 1060 with a length of two CPP across inner drain 1081 and the source between inner drain 1081 and inner drain 1082, and through yet another third wire segment of the metallization wire 1060 with a length of two CPP across inner drain 1082 and the source between inner drain 1082 and outer drain 1070, to yet another fourth wire segment of the metallization wire 1060 with a length of one CPP across outer drain 1070 that directly connects to the common output nodes of the first and second metallization wires 1060 of each type of MOS transistor and the third metallization wire 1065 of the 7-finger CMOS inverter 1040. FIG. 11D also shows that the relative current (2 units) of the diffusion region of inner drain 1081 travels through the yet another second wire segment of the metallization wire 1060 with a length of two CPP across inner drain 1081 and the source between inner drain 1081 and inner drain 1082, and through the yet another third wire segment of the metallization wire 1060 across inner drain 1082 and the source between inner drain 1082 and outer drain 1070, to the yet another fourth wire segment of the metallization wire 1060 that directly connects to the common output nodes of the first and second metallization wires 1060 of each type of MOS transistor and the third metallization wire 1065 of the 7-finger CMOS inverter 1040. FIG. 11D further shows that the relative current (2 units) of the diffusion region of inner drain 1082 travels through the yet another third wire segment of the metallization wire 1060 across inner drain 1082 and the source between inner drain 1082 and outer drain 1070, to the yet another fourth wire segment of the metallization wire 1060 that directly connects to the common output nodes of the first and second metallization wires 1060 of each type of MOS transistor and the third metallization wire 1065 of the 7-finger CMOS inverter 1040. FIG. 11D yet further shows that the relative current (1 unit) of the diffusion region of outer drain 1070 contacts the yet another fourth wire segment that directly connects to the common output nodes of the first and second metallization wires 1060 of each type of MOS transistor and the third metallization wire 1065 of the 7-finger CMOS inverter 1040.

Thus, the relative value for the total drain-node resistance, $R_d$, of each type of MOS transistor corresponding to FIG. 11D is equal to $112R_{M1,CPP}$, resulting from a sum of three products. The first product results from (i) the square of two units of relative current from the diffusion region of inner drain 1080, and (ii) the resistance of the yet another first wire segment of the metallization wire 1060 across inner drain 1080 and the source between inner drain 1080 and inner drain 1081 through which the current travels, to the yet another second wire segment of the metallization wire 1060. The length of the yet another first wire segment is two CPP with a resistance of $2R_{M1,CPP}$. The second product results from (i) the square of four units of relative current, i.e., two from inner drain 1080 plus two from inner drain 1081, and (ii) the resistance of the yet another second wire segment of the metallization wire 1060 across inner drain 1081 and the source between inner drain 1081 and inner drain 1082 through which the current travels, to the yet another third wire segment of the metallization wire 1060. The length of the yet another second wire segment is two CPP with a resistance of $2R_{M1,CPP}$. The third product results from (i) the square of six units of relative current, i.e., two inner drain 1080, plus two from inner drain 1081, plus two from inner drain 1082, and (ii) the resistance of the yet another third wire segment of the metallization wire 1060 across inner drain 1082 and the source between inner drain 1082 and outer drain 1070 through which the current travels, to the yet another fourth wire segment of the metallization wire 1060 that directly connects to the common output nodes of the first and second metallization wires 1060 of each type of MOS transistor and the third metallization wire 1065 of the 7-finger CMOS inverter 1040. The length of the yet another third wire segment is two CPP with a resistance of $2R_{M1,CPP}$.

Similar analyses for the relative value for the total drain-node resistance, $R_d$, of each type of MOS transistor, where the third metallization wire 1065 is formed between the common output nodes positioned above each of either of the sources disposed between inner drains 1080 and 1081, and between inner drains 1082 and outer drains 1070 of each type of MOS transistor of a 7-finger CMOS inverter, reveal such total drain-node resistances, $R_d$, to be larger than the total drain-node resistance, $R_d$, corresponding to the selected layout of FIG. 10B.

For the 7-finger CMOS inverter of FIGS. 10A, 10B, 10C and 10D, the total number of drains is even, i.e., 4, including one outer drain and an odd number, i.e., of inner drains. In this case, a common output node for each type of MOS transistor that is located at a segment of each of the first and second metallization wires 1060 above the central drain, i.e., inner drain 1081, of the odd number of inner drains, will maximize output current for the 7-finger CMOS inverter. Generally, for a multi-finger CMOS inverter, where the number of fingers may equal (4k+3) and k equals 1, 2, . . . , where the total number of drains is even, including one outer drain and an odd number of inner drains, the common output nodes may be located at the segment of each of the metallization wires 1060 of each type of MOS transistor above the central drain of the odd number of inner drains to maximize output current for the (4k+3)-finger CMOS inverter.

Figure 12:
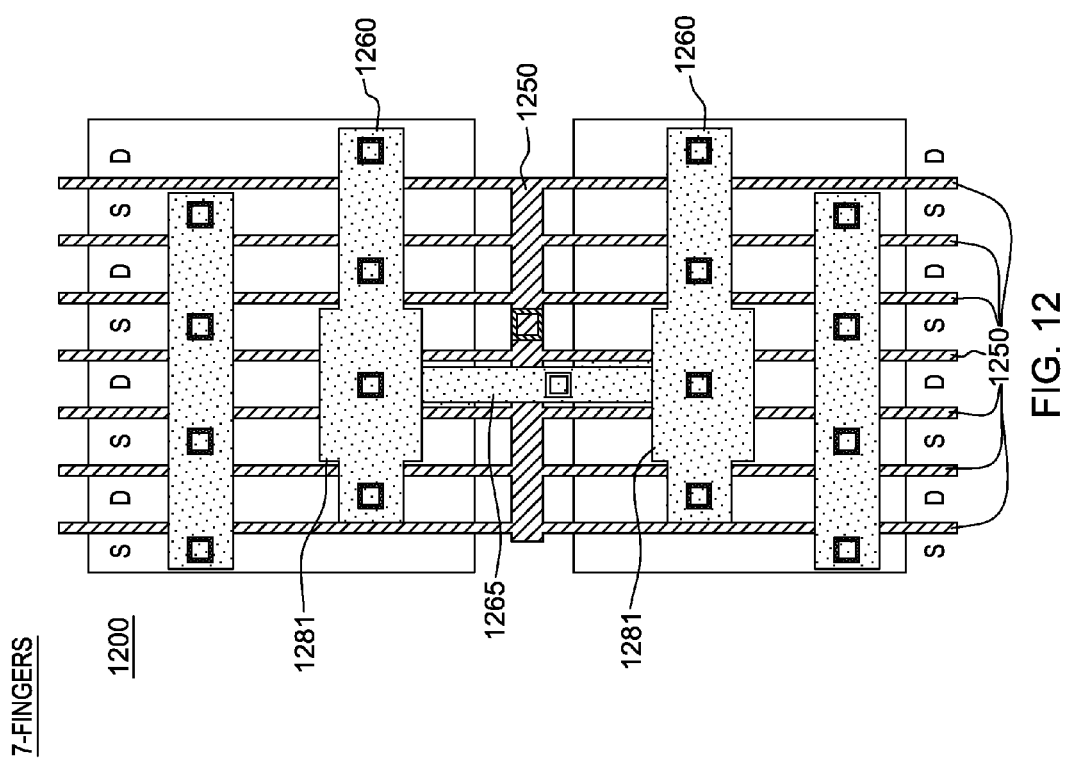
FIG. 12 is a schematic diagram illustrating a layout of a 7-finger CMOS inverter that widens segments of the metallization wires above at least a central drain of a number of inner drains for a method, a system and a product.

Referring to FIG. 12, for a 7-finger CMOS inverter 1200, the segment of each of the metallization wires 1260 of each type of MOS transistor above the length of the central drain of the odd number of inner drains 1281 and the segments adjacent to each side of the central drain of the odd number of inner drains 1281, which may correspond to lengths of adjacent sources, may be widened to prevent electromigration, without significantly increasing the capacitance of the wiring. Generally, for a multi-finger CMOS inverter, where the number of fingers may equal (4k+3) and k equals 1, 2, 3, . . . , the segment of each of the metallization wires of each type of MOS transistor above the length of the central drain of the odd number of inner drains and the segments adjacent to each side of the central drain of the odd number of inner drains, which may correspond to lengths of adjacent sources, may be widened to prevent electromigration, without significantly increasing the capacitance of the wiring.

Figure 13:
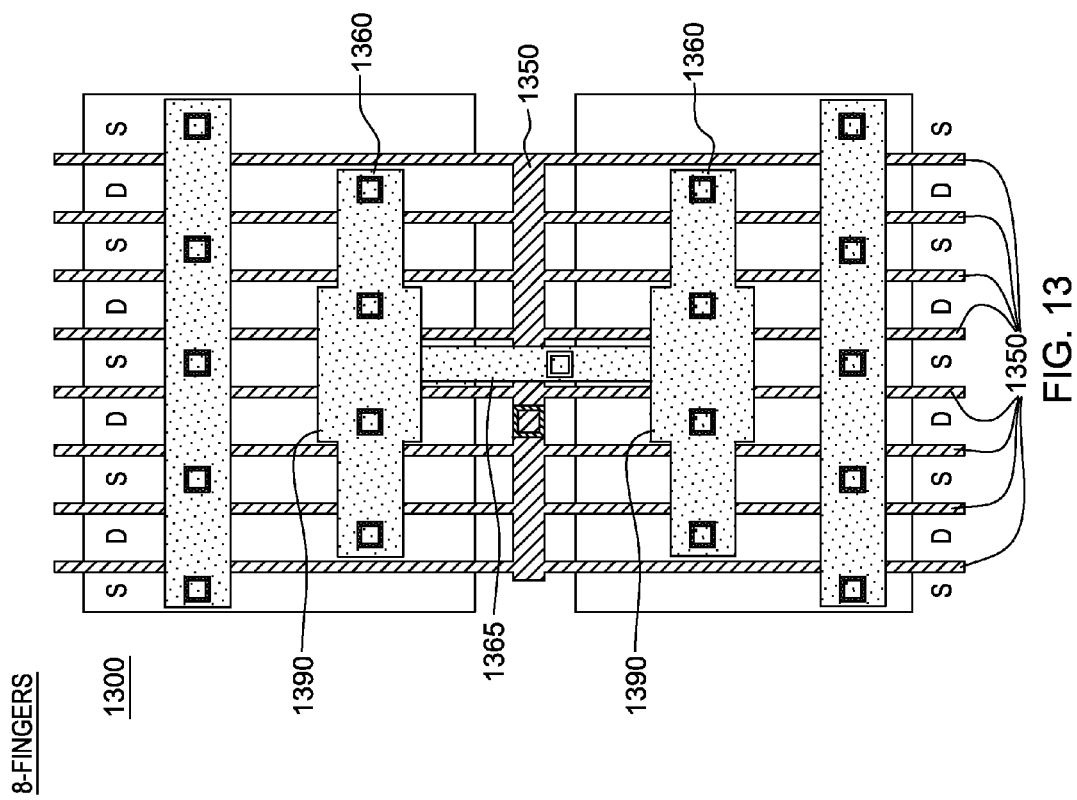
FIG. 13 is a schematic diagram illustrating a layout of an 8-finger CMOS inverter that widens segments of the metallization wires above at least two middle drains and between said two middle drains for a method, a system and a product.

Referring to FIG. 13, for an 8-finger CMOS inverter 1300, the segments 1390 of each of the metallization wires 1360 of each type of MOS transistor above the two middle inner drains and the source disposed between the two middle inner drains, may be widened to prevent electromigration, without significantly increasing the capacitance of the wiring. Generally, for a multi-finger CMOS inverter, where the number of fingers may equal a multiple of 4, i.e., (4k) where k equals 1, 2, 3, . . . , the segments of each of the metallization wires of each type of MOS transistor above the two middle inner drains and the source disposed between the two middle inner drains, may be widened to prevent electromigration, without significantly increasing the capacitance of the wiring.

Figure 14:
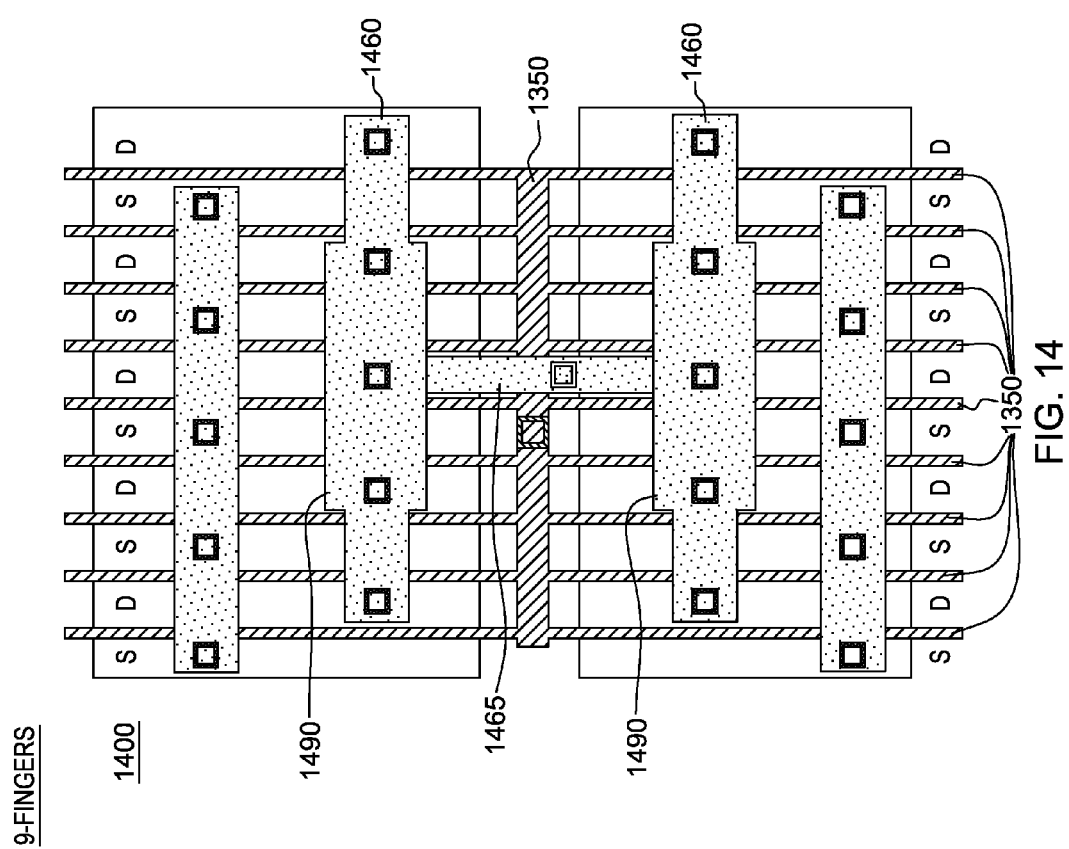
FIG. 14 is a schematic diagram illustrating a layout of a 9-finger CMOS inverter that widens segments of the metallization wires above at least a central drain of a total number of drains for a method, a system and a product.

Referring to FIG. 14, for a 9-finger CMOS inverter 1400, the segments 1490 of each of the metallization wires 1460 of each type of MOS transistor above the central drain of the total number of drains and extending to the adjacent drains on each side of the central drain may be widened to prevent electromigration, without significantly increasing the capacitance of the wiring. Generally, for a multi-finger CMOS inverter, where the number of fingers may equal (4k+1) and k equals 1, 2, 3, . . . , the segments of each of the metallization wires of each type of MOS transistor above the central drain of the total number of drains and extending to the adjacent drains on each side of the central drain may be widened to prevent electromigration, without significantly increasing the capacitance of the wiring.

Figure 15:
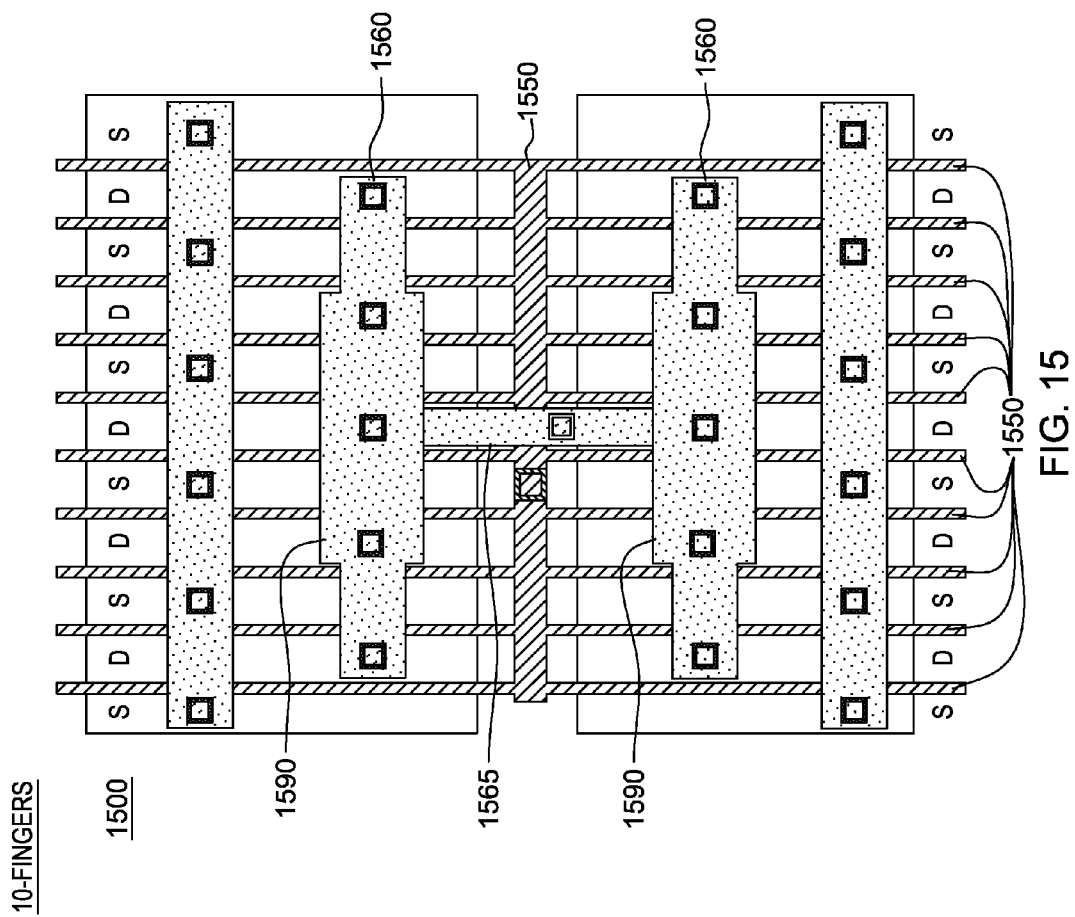
FIG. 15 is a schematic diagram illustrating a layout of a 10-finger CMOS inverter that widens segments of the metallization wires above at least a central drain of a number of inner drains for a method, a system and a product.

Referring to FIG. 15, for a 10-finger CMOS inverter 1400, the segments 1590 of each of the metallization wires 1560 of each type of MOS transistor above the central drain of the number of inner drains and extending to the adjacent drains on each side of the central drain may be widened to prevent electromigration, without significantly increasing the capacitance of the wiring. Generally, for a multi-finger CMOS inverter, where the number of fingers may equal (4k+2) and k equals 2, 3, . . . , the segments of each of the metallization wires of each type of MOS transistor above the central drain of the number of inner drains and extending to the adjacent drains on each side of the central drain may be widened to prevent electromigration, without significantly increasing the capacitance of the wiring.

Figure 16:
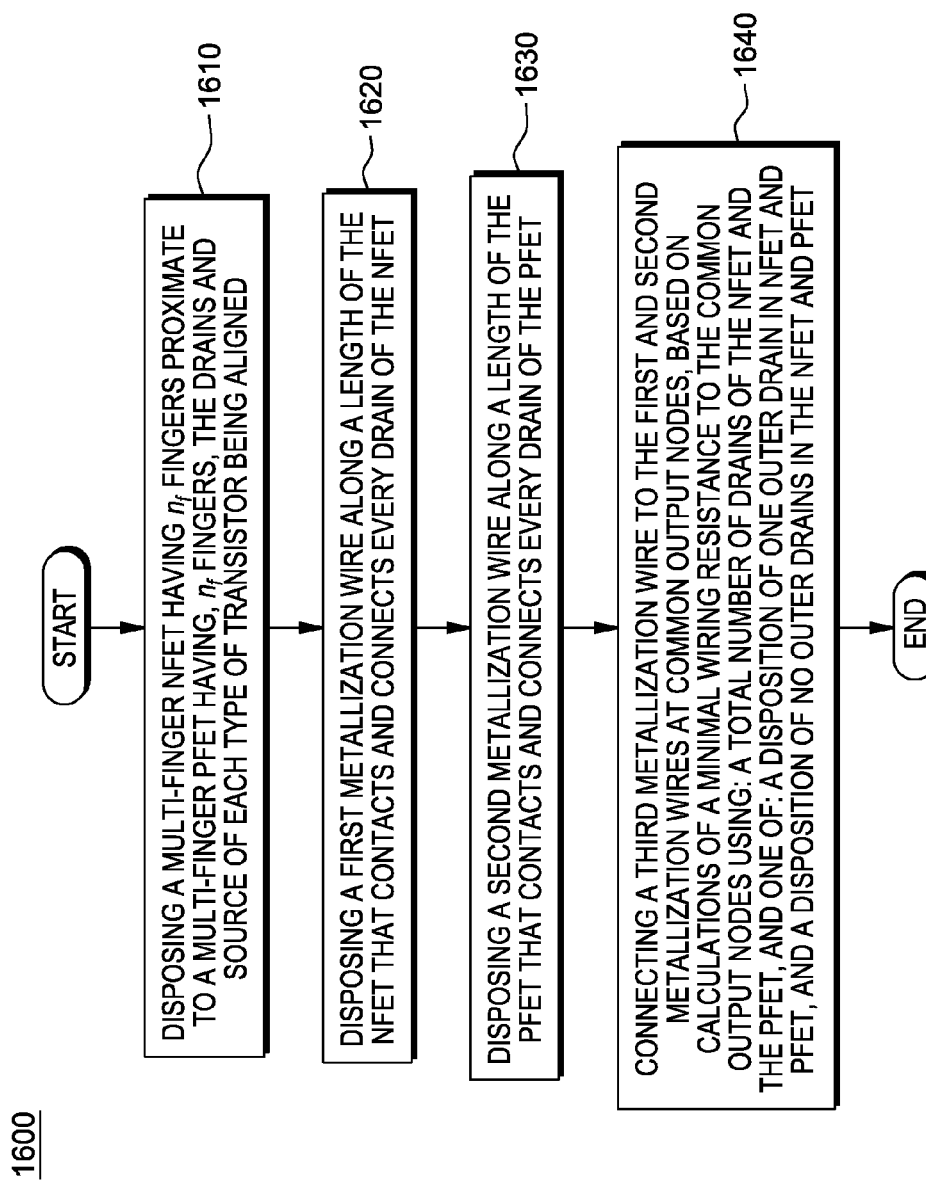
FIG. 16 illustrates a schematic flowchart for designing a layout of a multi-finger CMOS inverter for a method, a system and a product.

Referring to FIG. 16, a flow chart 1600 of a method of designing a layout for a multi-finger CMOS inverter is illustrated. The method may include disposing a multi-finger NFET, having $n_f$ fingers, proximate to a multi-finger PFET, also having $n_f$ fingers in a layout 1610. The $n_f$ fingers may contact multiple parallel gates of a common gate for each multi-finger NFET and multi-finger PFET, in which the multiple parallel gates may separate multiple drains and sources that are aligned for each multi-finger NFET and multi-finger PFET.

The method may also include disposing a first metallization wire, along a length of the multi-finger NFET 1620. The first metallization wire may connect to the multiple drains and sources and may contact every drain of the multi-finger NFET.

The method may further include disposing a second metallization wire, along a length of the multi-finger PFET 1630. The second metallization wire may connect to the multiple drains and sources and may contact every drain of the multi-finger PFET.

The method yet may further include connecting a third metallization wire to the first and second metallization wires at common output nodes for drain currents from the multi-finger NFET and the multi-finger PFET, respectively, based on calculations of a minimal wiring resistance of the first and second metallization wires to the output nodes using: a total number of drains of the multi-finger-NFET and the multi-finger PFET, and one of: a disposition of a single outer drain along an outer width of each multi-finger NFET and multi-finger PFET, and of at least one inner drain between two sources of each multi-finger NFET and multi-finger PFET; and a disposition of no outer drains along outer widths of each multi-finger NFET and multi-finger PFET, and of at least two inner drains, each being disposed between two sources, of each multi-finger NFET and multi-finger PFET 1640.

The method of calculating the minimal wiring resistance of the first and second metallization wires may further comprise one of four conditions: (1) if the total number of drains is even and if all of the total number of drains are inner drains, then disposing the common output nodes at segments of the first and second metallization wires above any one of: either of two middle inner drains or a location between the two middle inner drains of each multi-finger NFET and multi-finger PFET; (2) if the total number of drains is odd and the total number of drains includes only one outer drain, then disposing the common output nodes at segments of the first and second metallization wires above a central drain of the total number of drains of each multi-finger NFET and multi-finger PFET; (3) if the total number of drains is odd and if all of the total number of drains are inner drains, then disposing the common output nodes at segments of the first and second metallization wires above a central drain of the inner drains of each multi-finger NFET and multi-finger PFET; and (4) if the total number of drains is even and the total number of drains includes only one outer drain and a number of inner drains, then disposing the common output nodes at segments of the first and second metallization wires above a central drain of the number of inner drains of each multi-finger NFET and multi-finger PFET.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

According to a further embodiment herein, an article of manufacture is provided that includes a computer readable medium having computer readable instructions embodied therein for performing the steps of the computer implemented methods, including but not limited to the method illustrated in FIG. 16. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing.

As will be appreciated by one skilled in the art, aspects of the systems and methods herein may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments herein. It will be understood that each block of the flowchart illustrations and/or two-dimensional block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 17:
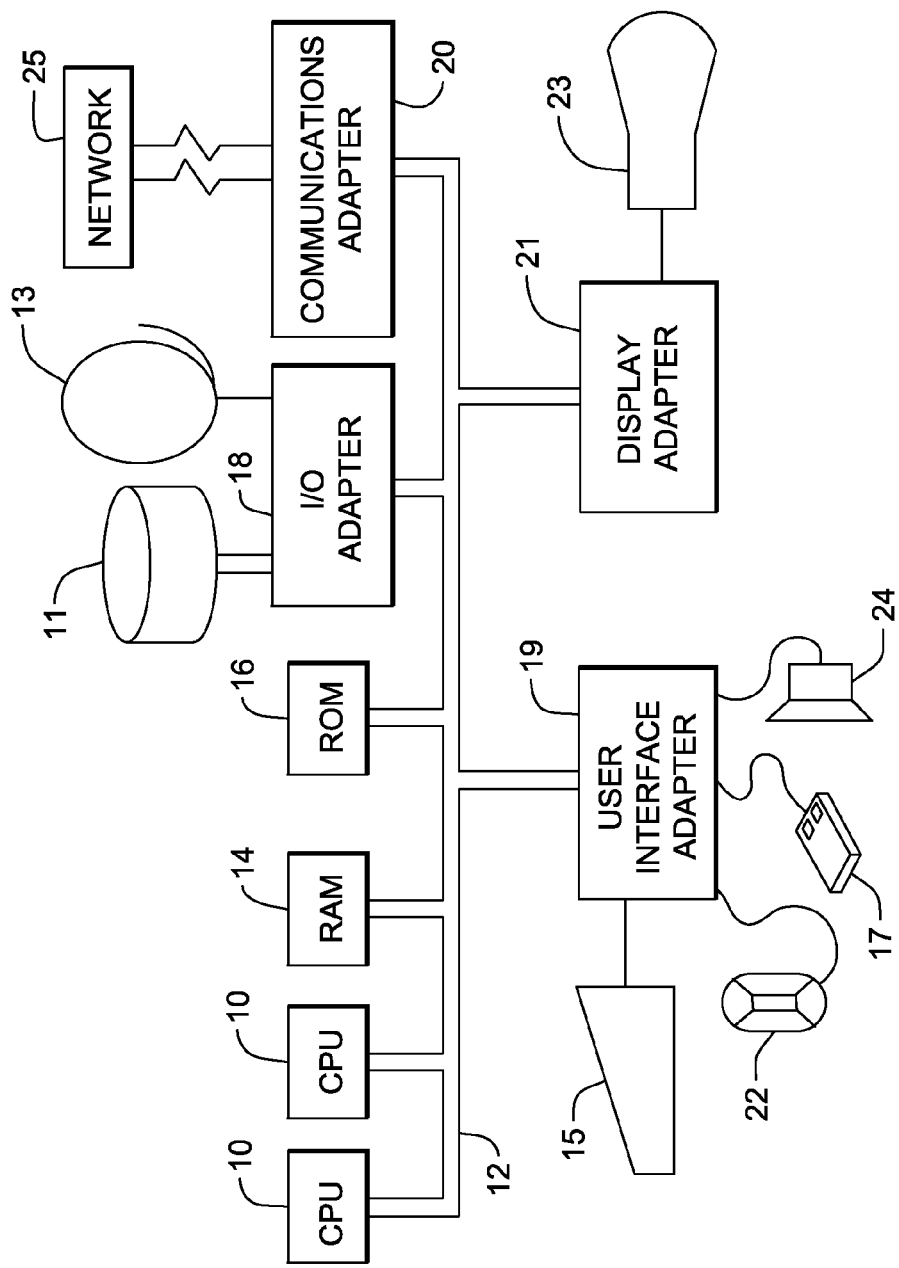
FIG. 17 is a schematic diagram illustrating a hardware environment for designing a layout of a multi-finger CMOS inverter for a method, a system and a product.

In FIG. 17, CPUs 10 perform various processing based on a program stored in a Read Only Memory (ROM) 16 or a program loaded from a peripheral device, such as disk units 11 and tape drives 13 to a Random Access Memory (RAM) 14. In the RAM 14, required data when the CPU 10 performs the various processing or the like is also stored as necessary. The CPU 10, the ROM 16, and the RAM 14 are connected to one another via a bus 12. An input/output adapter 18 is also connected to the bus 12 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 14, as necessary.

Those skilled in the art would appreciate that, the storage medium is not limited to the peripheral device having the program stored therein, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory, such as a "plug-and-play" memory device. Alternatively, the storage medium may be the ROM 16, a hard disk contained in the storage section 11, or the like, which has the program stored therein and is distributed to the user together with the device that contains them.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In case of implementing the embodiments herein by software and/or firmware, a program constituting the software may be installed into a computer with dedicated hardware, from a storage medium or a network such as the Internet, and the computer is capable of performing various functions if with various programs installed therein.

Deployment of the software includes loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process software may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 18:
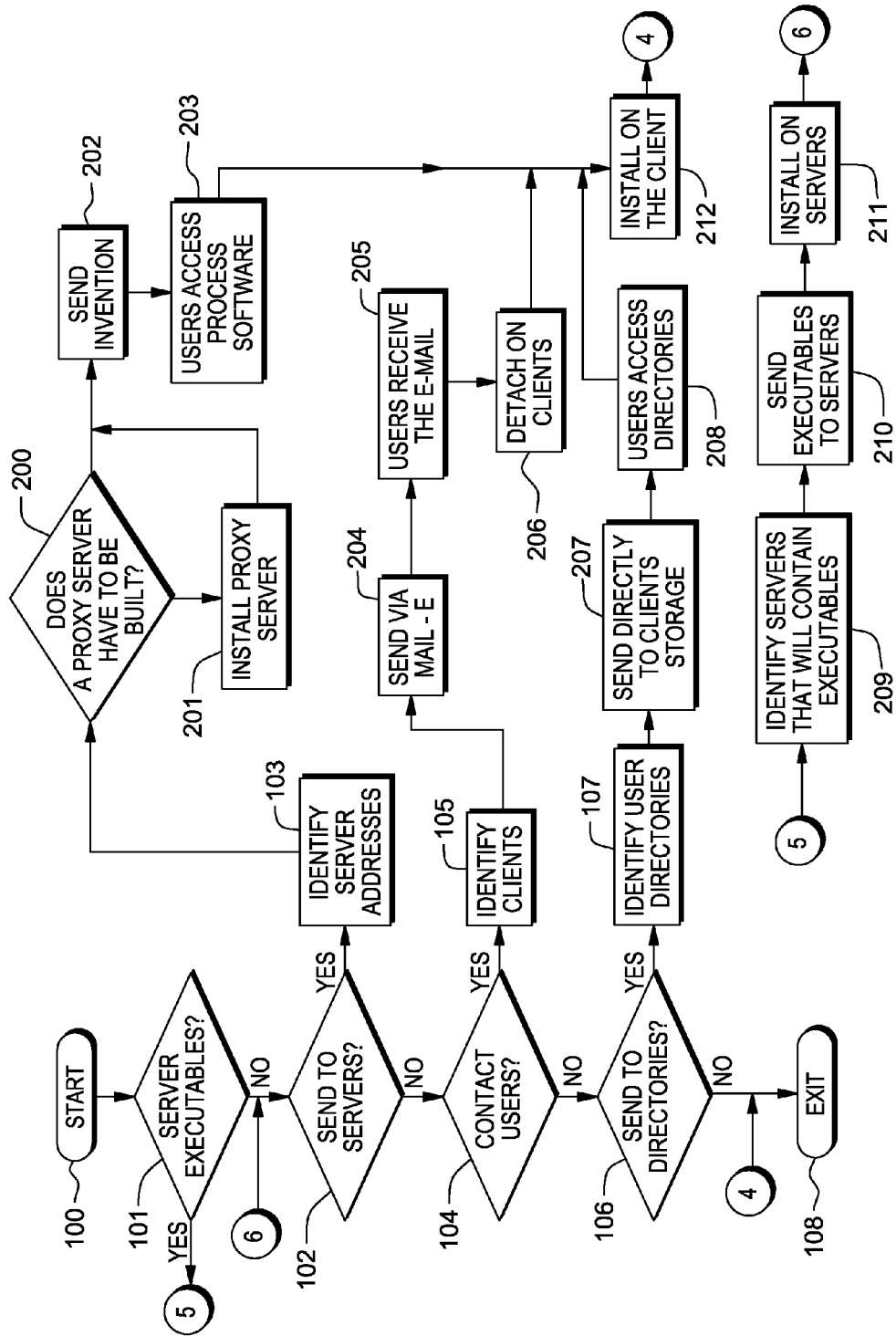
FIG. 18 is a schematic diagram of a deployment system according to embodiments herein.

In FIG. 18, Step 100 begins the deployment of the process software. The first thing is to determine if there are any programs that will reside on a server or servers when the process software is executed 101. If this is the case then the servers that will contain the executables are identified 209. The process software for the server or servers is transferred directly to the servers' storage via FTP or some other protocol or by copying though the use of a shared file system 210. The process software is then installed on the servers 211.

Next, a determination is made on whether the process software is be deployed by having users access the process software on a server or servers 102. If the users are to access the process software on servers then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212 then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers. The users then receive the e-mail 205 and then detach the process software from the e-mail to a directory on their client computers 206. The user executes the program that installs the process software on his client computer 212 then exits the process 108.

Lastly a determination is made on whether to the process software will be sent directly to user directories on their client computers 106. If so, the user directories are identified 107. The process software is transferred directly to the user's client computer directory 207. This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software 208. The user executes the program that installs the process software on his client computer 212 then exits the process 108.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 19:
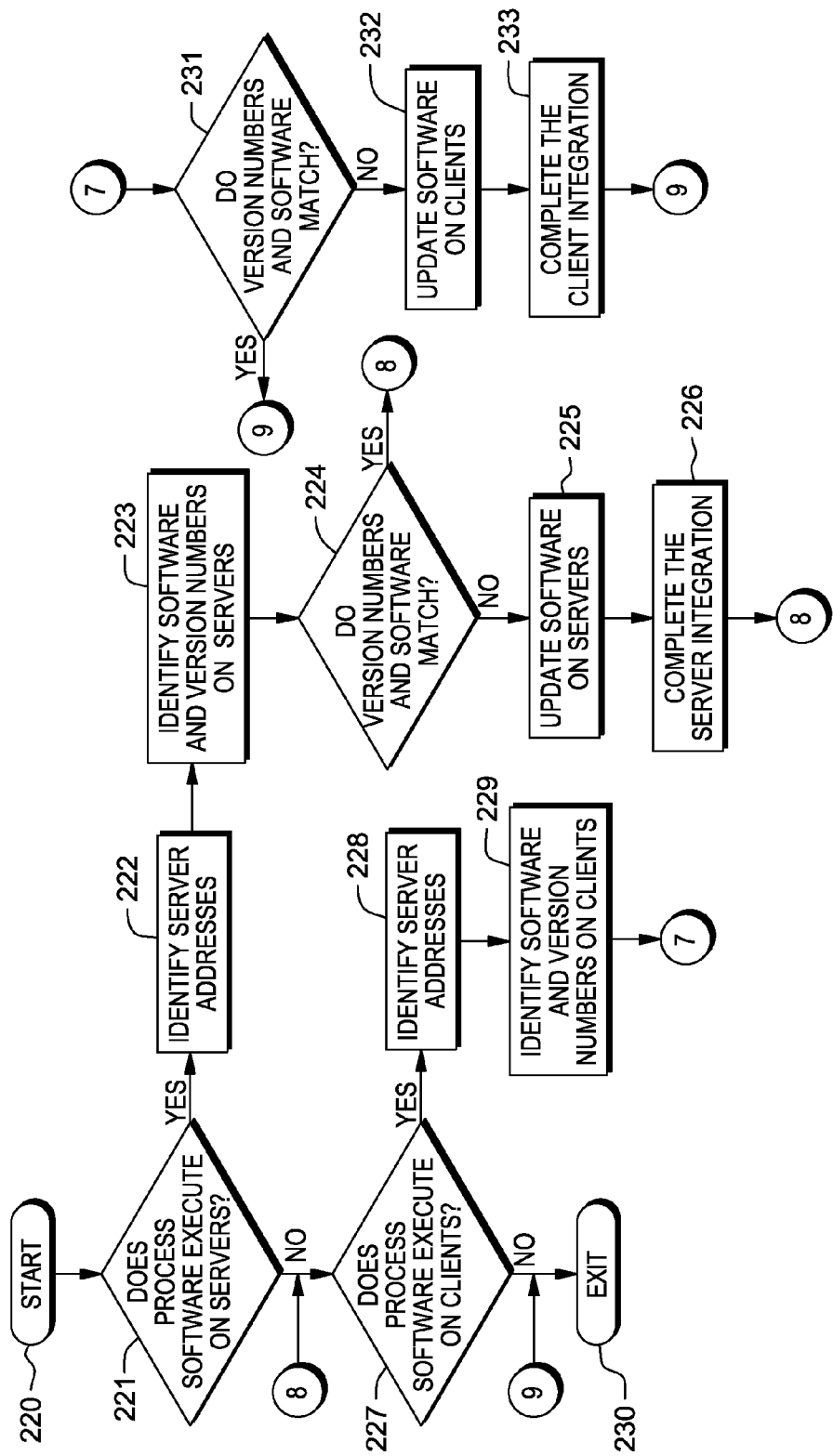
FIG. 19 is a schematic diagram of an integration system according to embodiments herein.

In FIG. 19, Step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, which have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally if there is missing required software, then it is updated on the server or servers 225. The server integration is completed by installing the process software 226.

Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, which have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider. In another embodiment, the service provider requests payment directly from a customer account at a banking or financial institution. In another embodiment, if the service provider is also a customer of the customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 20:
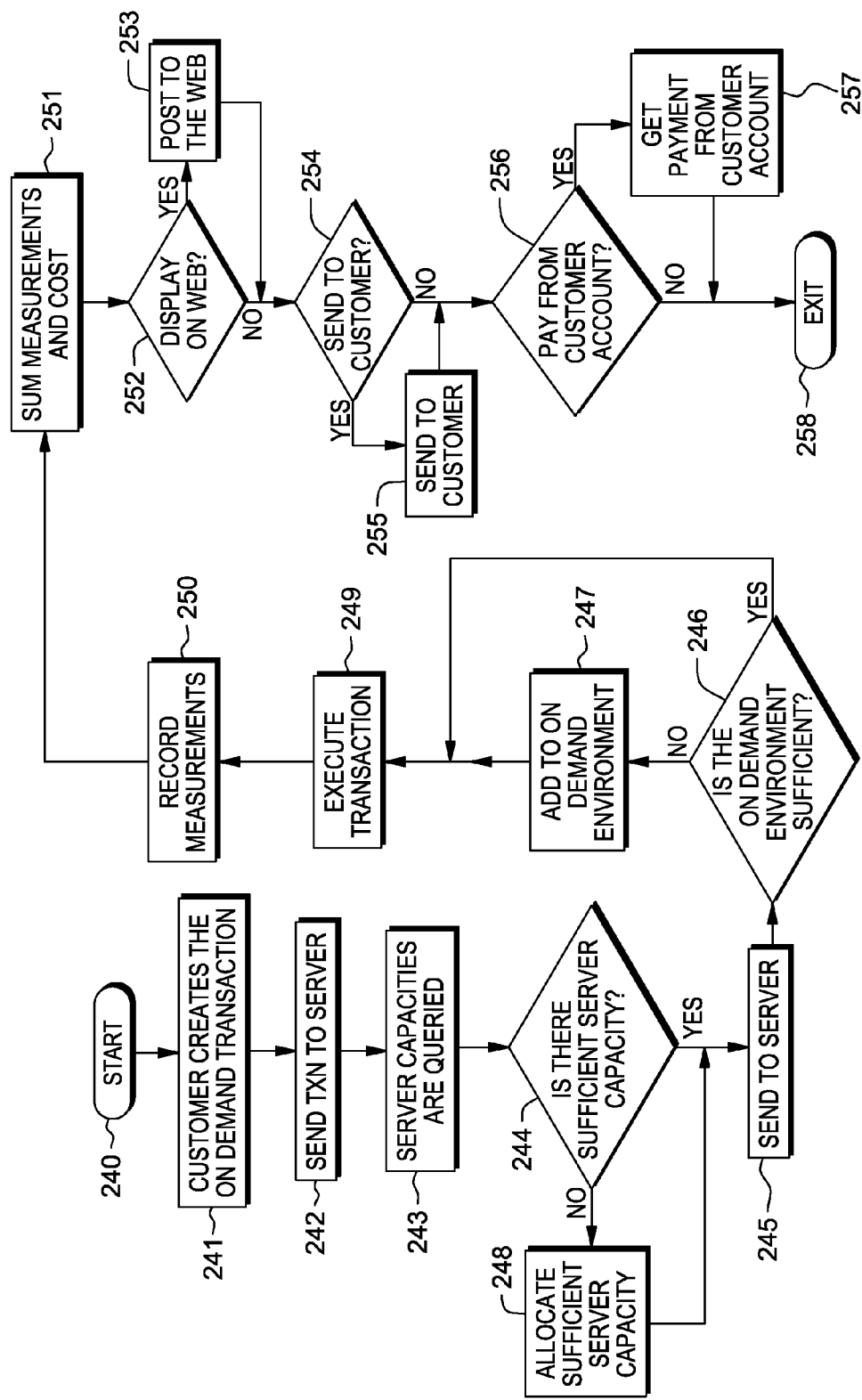
FIG. 20 is a schematic diagram of an on demand system according to embodiments herein.

In FIG. 20, Step 240 begins the On Demand process. A transaction is created than contains the unique customer identification, the requested service type and any service parameters that further specify the type of service 241. The transaction is then sent to the main server 242. In an On Demand environment the main server can initially be the only server, then as capacity is consumed other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next the required software to process the transaction is accessed, loaded into memory, then the transaction is executed 249.

The usage measurements are recorded 250. The usage measurements consists of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 21:
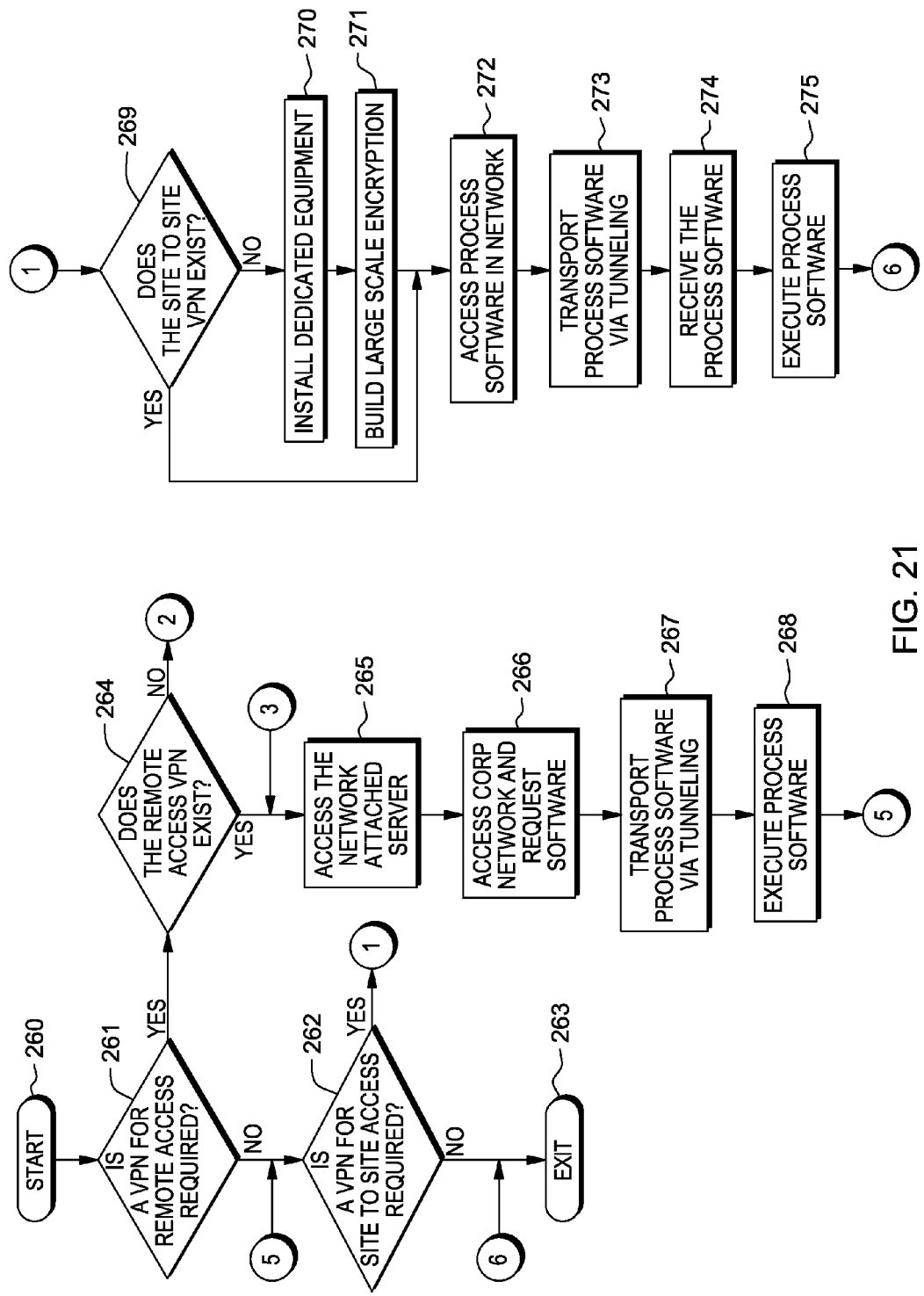
FIG. 21 is a schematic diagram of a virtual private network system according to embodiments herein.
Figure 22:
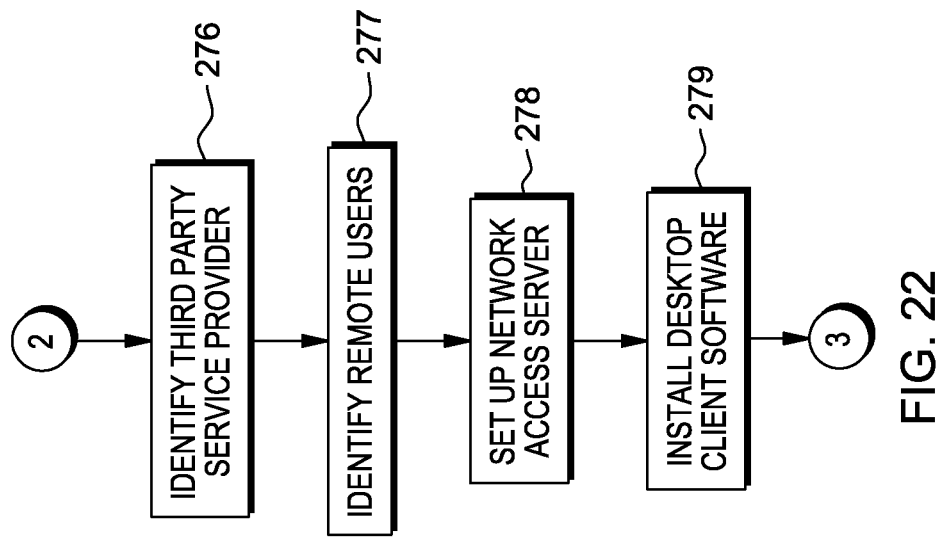
FIG. 22 is a schematic diagram of a virtual private network system according to embodiments herein.

In FIGS. 21 and 22, Step 260 begins the Virtual Private Network (VPN) process. A determination is made to see if a VPN for remote access is required 261. If it is not required, then proceed to 262. If it is required, then determine if the remote access VPN exists 264.

If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built or if it been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then build the large scale encryption into the VPN 271.

After the site to site VPN has been built or if it had been previously established, the users access the process software via the VPN 272. The process software is transported to the site users over the network via tunneling. That is the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method of designing a layout of a multi-finger CMOS inverter for maximal drain current, comprising:
    disposing, by a computer, a multi-finger N-type field effect transistor (NFET), having $n_f$ fingers, proximate to a multi-finger P-type field effect transistor (PFET), also having $n_f$ fingers, in said layout, said $n_f$ fingers contacting multiple parallel gates of a common gate for each multi-finger NFET and multi-finger PFET, said multiple parallel gates separating multiple drains and multiple sources that are aligned for each multi-finger NFET and multi-finger PFET;
    disposing, by said computer, a first metallization wire, along a length of said multi-finger NFET in said layout, said first metallization wire connecting said multiple drains and contacting every drain of said multi-finger NFET;
    disposing, by said computer, a second metallization wire, along a length of said multi-finger PFET in said layout, said second metallization wire connecting said multiple drains and contacting every drain of said multi-finger PFET; and
    connecting, by said computer, a third metallization wire to said first and said second metallization wires at common output nodes for drain currents from said multi-finger NFET and said multi-finger PFET, respectively, in said layout, based on calculations of a minimal wiring resistance to said output nodes using:
        a total number of drains of said multi-finger NFET and said multi-finger PFET, and one of:
            a disposition of one outer drain along an outer width of each multi-finger NFET and multi-finger PFET, and of at least one inner drain between two sources of each multi-finger NFET and multi-finger PFET, and
            a disposition of no outer drains along outer widths of each multi-finger NFET and multi-finger PFET, and of at least two inner drains, each being disposed between two sources, of said each multi-finger NFET and multi-finger PFET.

2. The method of claim 1, said calculations of a minimal wiring resistance further comprising:
    if said total number of drains is even and if all said total number of drains are inner drains, then disposing said common output nodes at locations of said first and second metallization wires above any one of: either of two middle inner drains and between said two middle inner drains of each multi-finger NFET and multi-finger PFET;
    if said total number of drains is odd and said total number of drains includes only one outer drain, then disposing said common output nodes at locations of said first and second metallization wires above a central drain of said total number of drains of each multi-finger NFET and multi-finger PFET;
    if said total number of drains is odd and if all said total number of drains are inner drains, then disposing said common output nodes at locations of said first and second metallization wires above a central drain of said inner drains of each multi-finger NFET and multi-finger PFET; and
    if said total number of drains is even and said total number of drains includes only one outer drain and a number of inner drains, then disposing said common output nodes at locations of said first and second metallization wires above a central drain of said number of inner drains of each multi-finger NFET and multi-finger PFET.

3. The method of claim 2, for the case of said total number of drains being even and all of said total number of drains being inner drains, determining a number of fingers, $n_f$, of said each multi-finger NFET and PFET by (4k), where k equals 1, 2, 3 . . . .

4. The method of claim 2, for the case of said total number of drains being odd and said total number of drains including only one outer drain, determining a number of fingers, $n_f$, of said each multi-finger NFET and PFET by (4k+1), where k equals 1, 2, . . . .

5. The method of claim 2, for the case of said total number of drains being odd and all of said total number of drains being inner drains, determining a number of fingers, $n_f$, of said each multi-finger NFET and PFET by (4k+2), where k equals 1, 2, . . . .

6. The method of claim 2, for the case of said total number of drains being even and said total number of drains including only one outer drain, determining a number of fingers, $n_f$, of said each multi-finger NFET and PFET by (4k+3), where k equals 0, 1, 2, . . . .

7. The method of claim 2, for the case of said total number of drains being even and all of said total number of drains being inner drains, where a number of fingers may equal (4k) and k equals 2, 3, . . . , widening segments of each of said first and second metallization wires of each type of MOS transistor above at least two middle inner drains and a source disposed between said two middle inner drains; and for the case of said total number of drains being odd and said total number of drains including only one outer drain, where a number of fingers may equal (4k+1) and k equals 2, 3, . . . , widening segments of each of said first and second metallization wires of each type of MOS transistor above at least a central drain of said total number of drains and extending to adjacent drains on each side of said central drain.

8. The method of claim 2, for the case of said total number of drains being odd and all of said total number of drains being inner drains, where a number of fingers may equal (4k+2) and k equals 2, 3, . . . , widening segments of each of said first and second metallization wires of each type of MOS transistor above at least a central drain of a number of said inner drains and extending to adjacent drains on each side of said central drain; and for the case of said total number of drains being even and said total number of drains including only one outer drain, where a number of fingers may equal (4k+3) and k equals 1, 2, 3, . . . , widening segments of each of said first and second metallization wires of each type of MOS transistor above at least a central drain of an odd number of said inner drains and adjacent segments to each side of said central drain.

9. A computer system for designing a layout of a multi-finger CMOS inverter for maximal drain current, said system comprising:
    a memory storing a number of fingers, $n_f$, of a multi-finger N-type field effect transistor (NFET) and of a multi-finger P-type field effect transistor (PFET), also having $n_f$ fingers, in said multi-finger CMOS inverter; and a processor that:
disposes said multi-finger NFET proximate to a multi-finger PFET in said layout, said $n_f$ fingers contacting multiple parallel gates of a common gate for each multi-finger NFET and multi-finger PFET, said multiple parallel gates separating multiple drains and multiple sources that are aligned for each multi-finger NFET and multi-finger PFET;

disposes a first metallization wire along a length of said multi-finger NFET in said layout, said first metallization wire connecting said multiple drains and contacting every drain of said multi-finger NFET;

disposes a second metallization wire along a length of said multi-finger PFET in said layout, said the second metallization wire connecting said multiple drains and contacting every drain of said multi-finger PFET; and connects a third metallization wire to said first and said second metallization wires at common output nodes for drain currents from said multi-finger NFET and said multi-finger PFET, respectively, in said layout, based on calculations of a minimal wiring resistance to said output nodes using:
a total number of drains of said multi-finger NFET and said multi-finger PFET, and one of:
a disposition of one outer drain along an outer width of each multi-finger NFET and multi-finger PFET, and of at least one inner drain between two sources of each multi-finger NFET and multi-finger PFET, and
a disposition of no outer drains along outer widths of each multi-finger NFET and multi-finger PFET, and of at least two inner drains, each being disposed between two sources, of said each multi-finger NFET and multi-finger PFET.

10. The system of claim 9, said processor performing calculations of a minimal wiring resistance that further comprise:
if said total number of drains is even and if all said total number of drains are inner drains, then disposing said common output nodes at locations of said first and second metallization wires above any one of: either of two middle inner drains and between said two middle inner drains of each multi-finger NFET and multi-finger PFET;

if said total number of drains is odd and said total number of drains includes only one outer drain, then disposing said common output nodes at locations of said first and second metallization wires above a central drain of said total number of drains of each multi-finger NFET and multi-finger PFET;

if said total number of drains is odd and if all said total number of drains are inner drains, then disposing said common output nodes at locations of said first and second metallization wires above a central drain of said inner drains of each multi-finger NFET and multi-finger PFET; and if said total number of drains is even and said total number of drains includes only one outer drain and a number of inner drains, then disposing said common output nodes at locations of said first and second metallization wires above a central drain of said number of inner drains of each multi-finger NFET and multi-finger PFET.

11. The system of claim 10, for the case of said total number of drains being even and all of said total number of drains being inner drains, determining a number of fingers, $n_f$, of said each multi-finger NFET and PFET by $(4k)$, where k equals 1, 2, 3 . . . .

12. The system of claim 10, for the case of said total number of drains being odd and said total number of drains including only one outer drain, determining a number of fingers, $n_f$, of said each multi-finger NFET and PFET by $(4k+1)$, where k equals 1, 2 . . . .

13. The system of claim 10, for the case of said total number of drains being odd and all of said total number of drains being inner drains, determining a number of fingers, $n_f$, of said each multi-finger NFET and PFET by $(4k+2)$, where k equals 1, 2, . . . .

14. The system of claim 10, for the case of said total number of drains being even and said total number of drains including only one outer drain, determining a number of fingers, $n_f$, of said each multi-finger NFET and PFET by $(4k+3)$, where k equals 0, 1, 2, . . . .

15. A tangible computer program product readable by computer, storing a program of instructions executable by said computer to perform a method of designing a layout for a multi-finger CMOS inverter, said method comprising:
disposing a multi-finger N-type field effect transistor (NFET), having $n_f$ fingers, proximate to a multi-finger P-type field effect transistor (PFET), also having $n_f$ fingers, in said layout, said $n_f$ fingers contacting multiple parallel gates of a common gate for each multi-finger NFET and multi-finger PFET, said multiple parallel gates separating multiple drains and multiple sources that are aligned for each multi-finger NFET and multi-finger PFET;

disposing a first metallization wire, along a length of said multi-finger NFET in said layout, said first metallization wire connecting said multiple drains and contacting every drain of said multi-finger NFET;

disposing a second metallization wire, along a length of said multi-finger PFET in said layout, said second metallization wire connecting said multiple drains and contacting every drain of said multi-finger PFET; and connecting a third metallization wire to said first and said second metallization wires at common output nodes for drain currents from said multi-finger NFET and said multi-finger PFET, respectively, in said layout, based on calculations of a minimal wiring resistance to said output nodes using:
a total number of drains of said multi-finger NFET and said multi-finger PFET, and one of:
a disposition of one outer drain along an outer width of each multi-finger NFET and multi-finger PFET, and of at least one inner drain between two sources of each multi-finger NFET and multi-finger PFET, and
a disposition of no outer drains along outer widths of each multi-finger NFET and multi-finger PFET, and of at least two inner drains, each being disposed between two sources, of said each multi-finger NFET and multi-finger PFET.

16. The tangible computer program product of claim 15, said calculations of a minimal wiring resistance further comprising:
if said total number of drains is even and if all said total number of drains are inner drains, then disposing said common output nodes at low wire-to-gate-capacitance locations of said first and second metallization wires above any one of: either of two middle inner drains and between said two middle inner drains of each multi-finger NFET and multi-finger PFET;

if said total number of drains is odd and said total number of drains includes only one outer drain, then disposing said common output nodes at low wire-to-gate-capacitance locations of said first and second metallization wires above a central drain of said total number of drains of each multi-finger NFET and multi-finger PFET;

if said total number of drains is odd and if all said total number of drains are inner drains, then disposing said common output nodes at low wire-to-gate-capacitance locations of said first and second metallization wires above a central drain of said inner drains of each multi-finger NFET and multi-finger PFET; and if said total number of drains is even and said total number of drains includes only one outer drain and a number of inner drains, then disposing said common output nodes at locations of said first and second metallization wires above a central drain of said number of inner drains of each multi-finger NFET and multi-finger PFET.

17. The tangible computer program product of claim 15, for the case of said total number of drains being even and all of said total number of drains being inner drains, determining a number of fingers, $n_f$, of said each multi-finger NFET and PFET by (4k), where k equals 1, 2, 3 . . . .

18. The tangible computer program product of claim 15, for the case of said total number of drains being odd and said total number of drains including only one outer drain, determining a number of fingers, $n_f$, of said each multi-finger NFET and PFET by (4k+1), where k equals 1, 2 . . . .

19. The tangible computer program product of claim 15, for the case of said total number of drains being odd and all of said total number of drains being inner drains, determining a number of fingers, $n_f$, of said each multi-finger NFET and PFET by (4k+2), where k equals 1, 2, . . . .

20. The tangible computer program product of claim 15, for the case of said total number of drains being even and said total number of drains including only one outer drain, determining a number of fingers, $n_f$, of said each multi-finger NFET and PFET by (4k+3), where k equals 0, 1, 2, . . . .

* * * * *